US012668880B2

(12) United States Patent
Naveh

(10) Patent No.: US 12,668,880 B2
(45) Date of Patent: Jun. 30, 2026

(54) GRAPHENE COATED METALLIC SURFACES, DEVICES AND METHOD OF MANUFACTURE THEREOF

(71) Applicants: 2D GENERATION LTD., Yehud-Monosson (IL); BAR-ILAN UNIVERSITY, Ramat Gan (IL)

(72) Inventor: Doron Yaacov Naveh, Petach Tikva (IL)

(73) Assignees: 2D GENERATION LTD., Yahud-Monosson (IL); BAR-ILAN UNIVERSITY, Ramat Gan (IL)

( * ) Notice: Subject to any disclaimer, the term of this patent is extended or adjusted under 35 U.S.C. 154(b) by 237 days.

(21) Appl. No.: 18/692,223

(22) PCT Filed: Sep. 20, 2022

(86) PCT No.: PCT/IL2022/051010
§ 371 (c)(1),
(2) Date: Mar. 14, 2024

(87) PCT Pub. No.: WO2023/042210
PCT Pub. Date: Mar. 23, 2023

(65) Prior Publication Data

US 2025/0137126 A1 May 1, 2025

Related U.S. Application Data

(60) Provisional application No. 63/245,956, filed on Sep. 20, 2021.

(51) Int. Cl.
*C23C 16/455* (2006.01)
*C23C 16/26* (2006.01)

(52) U.S. Cl.
CPC ........ *C23C 16/45553* (2013.01); *C23C 16/26* (2013.01)

(58) Field of Classification Search
None
See application file for complete search history.

(56) References Cited

U.S. PATENT DOCUMENTS 6,110,817 A 8/2000 Tsai et al.
7,259,463 B2 8/2007 Huang et al.
(Continued)

FOREIGN PATENT DOCUMENTS

CN 102593098 A 7/2012
CN 102709155 A 10/2012
(Continued)

OTHER PUBLICATIONS

Kozbial—surface-energy-of-graphene-by-contact-angle—2014 (Year: 2014).*
(Continued)

*Primary Examiner* — John Vincent Lawler
(74) *Attorney, Agent, or Firm* — The Roy Gross Law Firm, LLC; Roy D. Gross

(57) ABSTRACT

A method for coating a metallic surface by a graphene layer by depositing a graphene molecular precursor comprising a compound having an aromatic hydrocarbon component that is derivatized by a tethering group. The tethering groups react with the metallic surface to form a covalent bond between the compound of the graphene molecular precursor and the non-metallic surface, and the graphene molecular precursor is transformed into a graphene interfacial layer which is covalently bound to the non-metallic surface.

20 Claims, 4 Drawing Sheets

(56) References Cited

U.S. PATENT DOCUMENTS

| | | | | | |
|---|---|---|---|---|---|
| 8,716,863 | B2 | 5/2014 | Wann et al. | | |
| 8,808,810 | B2 | 8/2014 | Veerasamy | | |
| 8,974,617 | B2 | 3/2015 | Hu et al. | | |
| 9,006,095 | B2 | 4/2015 | Yang et al. | | |
| 9,142,505 | B2 | 9/2015 | Yang et al. | | |
| 9,318,439 | B2 | 4/2016 | Yang et al. | | |
| 9,330,970 | B2 | 5/2016 | Wann et al. | | |
| 9,385,034 | B2 | 7/2016 | Chang et al. | | |
| 10,050,104 | B2 | 8/2018 | Jou et al. | | |
| 10,683,586 | B2 | 6/2020 | Ozyilmaz et al. | | |
| 2011/0033677 | A1* | 2/2011 | Shin | C01B 32/184 | 252/502 |
| 2011/0143045 | A1* | 6/2011 | Veerasamy | C01B 32/194 | 427/510 |
| 2011/0210282 | A1 | 9/2011 | Foley | | |
| 2012/0141799 | A1 | 6/2012 | Kub et al. | | |
| 2013/0299988 | A1 | 11/2013 | Bonilla et al. | | |
| 2014/0263166 | A1 | 9/2014 | Shin et al. | | |
| 2015/0023860 | A1* | 1/2015 | Lee | C23C 16/325 | 423/325 |
| 2015/0270350 | A1 | 9/2015 | Lagally et al. | | |
| 2016/0202613 | A1 | 7/2016 | Di et al. | | |
| 2016/0270237 | A1 | 9/2016 | Cho et al. | | |
| 2017/0148631 | A1 | 5/2017 | Beasley et al. | | |
| 2018/0005952 | A1 | 1/2018 | Zhou | | |
| 2018/0033734 | A1 | 2/2018 | Zhou | | |
| 2018/0212151 | A1 | 7/2018 | Chen et al. | | |
| 2020/0135655 | A1 | 4/2020 | Yang et al. | | |
| 2020/0186938 | A1 | 6/2020 | Zeltzer et al. | | |
| 2021/0217660 | A1 | 7/2021 | Huang et al. | | |
| 2022/0254641 | A1 | 8/2022 | Chua et al. | | |

FOREIGN PATENT DOCUMENTS

| | | | |
|---|---|---|---|
| CN | 103943562 | A | 7/2014 |
| CN | 104589725 | B | 12/2016 |
| CN | 107658264 | A | 2/2018 |
| CN | 110666158 | A | 1/2020 |
| CN | 217455186 | U | 9/2022 |
| DE | 102022204958 | A1 | 11/2022 |
| DE | 102024114275 | A1 | 11/2024 |
| JP | 2013513544 | A | 4/2013 |
| KR | 101199538 | B1 | 11/2012 |
| KR | 101472118 | B1 | 12/2014 |
| WO | 2013/136908 | A1 | 9/2013 |
| WO | 2016/156659 | A1 | 10/2016 |
| WO | 2021/138665 | A1 | 7/2021 |
| WO | 2021/156196 | A1 | 8/2021 |
| WO | 2023/004328 | A1 | 1/2023 |
| WO | 2023/004329 | A1 | 1/2023 |
| WO | 2023/275873 | A1 | 1/2023 |
| WO | 2023/042210 | A1 | 3/2023 |

OTHER PUBLICATIONS

A Manikandan, H Medina, YZ Chen "Low Temperature Grown Graphene on Ultra-Long Copper Nanowire By Carbon-Enclosed Chemical Vapor Deposition As Stable Transparent Conducting Electrodes"; ECS Meeting Abstracts, vol. MA2016-02, H04-Low-Dimensional Nanoscale Electronic and Photonic Devices 9, 2016—iopscience.iop.org.

Araujo P. T. et al. Defects and impurities in graphene-like materials, Materials Today 2012, 15, 98-109, https://doi.org/10.1016/S1369-7021(12)70045-7.

Bum Jun Kim, Tuqeer Nasir, and Jae-Young Choi "Direct Growth of Graphene at Low Temperature for Future Device Applications"; Journal of the Korean Ceramic Society 2018, 55, 203-223. DOI:10.4191/kcers.2018.55.3.12.

D Nakayama, H Baba, N Toyoda, I Yamada "Relatively low temperature deposition of graphene like films with ethane GCIB irradiation"; Surface and Coatings Technology, 2016—Elsevier; vol. 306, Part A, Nov. 25, 2016, pp. 218-221. https://doi.org/10.1016/j.surfcoat.2016.06.002.

D Zhou, Y Cui, BH Han "Synthesis and Modification of Graphene"; Graphene Optoelectronics: 2014—Wiley Online Library. DOI:10.1002/9783527677788.ch2.

Dapeng Wei and Xianfan Xu "Laser direct growth of graphene on silicon substrate"; Appl. Phys. Lett. 2012, 100, 023110.

G Kalita, K Wakita, M Umeno "Low temperature growth of graphene film by microwave assisted surface wave plasma CVD for transparent electrode application"; Royal Society of Chemistry, RSC Adv., 2012, 2, 2815-2820. DOI: 10.1039/C2RA00648K.

H. Van Bui, a, F. Grilloa and J. R. van Ommena "Atomic and Molecular Layer Deposition: Off the Beaten Track"; Chem. Commun., 2017, 53, 45-71. DOI:10.1039/C6CC05568K.

Houman Zahedmanesh, Victor Vega Gonzalez, and Zsolt Tokei "Nano-Ridge Bending during Conformal Ruthenium Metallization: Implications for Interconnect Fabrication"; ACS Appl. Nano Mater. 2021, 4, 5643-5648. DOI:10.1021/acsanm.1c00773.

Hu J, Ji Y, Shi Y, Hui F, Duan H, Lanza M. A review on the use of graphene as a protective coating against corrosion. Ann. J. Mater. Sci. Eng. 2014;1:16. Hu J, et al (Nov. 1, 2014).

Huaqiang Cao, Cheng Wang, Baojun Li, Tianyu Chen, Peng Han, Yan Zhang, Haijun Yang, Qunyang Li, Anthony K. Cheetham "Successive Free-Radical C(sp2)-C(sp2) Coupling Reactions to Form Graphene"; CCS Chem. 2021, 3, 2735-2748. DOI:10.31635/ccschem.021.202100919.

J Sun, Y Chen, X Cai, B Ma, Z Chen, M Priydarshi "Direct low temperature synthesis of graphene on arbitrary glasses by plasma-enhanced CVD for versatile, cost-effective electrodes"; Nano Res, 2015. https://doi.org/10.1007/s12274-015-0849-0.

Jaeho Kim, Hajime Sakakita, and Hiromoto Itagaki "Low-Temperature Graphene Growth by Forced Convection of Plasma-Excited Radicals"; Nano Lett. 2019, 19, 739-746. . DOI: 10.1021/acs.nanolett.8b03769.

Jisu Jang, Myungwoo Son, Sunki Chung, Kihyeun Kim, Chunhum Cho, Byoung Hun Lee and Moon-Ho Ham "Low-temperature-grown continuous graphene films from benzene by chemical vapor deposition at ambient pressure"; Scientific Reports, 5:17955, 1-7, DOI: 10.1038/srep17955.

Jiyu Cai, Xiaoxiao Han, Xin Wang, and Xiangbo Meng "Atomic Layer Deposition of Two-Dimensional Layered Materials: Processes, Growth Mechanisms, and Characteristics"; Matter 2, 587-630, Mar. 4, 2020.

Lang Jiang, Tianchao Niu, Xiuqiang Lu, Huanli Dong, Wei Chen, Yunqi Liu, Wenping Hu, and Daoben Zhu "Low-Temperature, Bottom-Up Synthesis of Graphene via a Radical-Coupling Reaction"; J. Am. Chem. Soc. 2013, 135, 9050-9054. doi: 10.1021/ja4031825. Epub Jun. 4, 2013. PMID: 23701398.

M. Stelzer et al. Graphenic Carbon: A Novel Material to Improve the Reliability of Metal-Silicon Contacts. IEEE Journal of the Electron Devices Society, 2017, 5, 416-425. 10.1109/JEDS.2017.2724841.

M. Tsai, S. Sun, C. Tsai, S. Chuang, and H.-T. Chiu, "Comparison of the diffusion barrier properties of chemical-vapor-deposited TaN and sputtered TaN between Cu and Si", Journal of Applied Physics, vol. 79, No. 9, pp. 6932-6938, 1996. https://doi.org/10.1063/1.361518.

Manjit Kaur, Neena Gupta, Sanjeev Kumar, Balwinder Raj, Arun K. Singh "RF analysis of intercalated graphene nanoribbon-based global-level interconnects"; Journal of Computational Electronics 2020 19:1002-1013. https://doi.org/10.1007/s10825-020-01530-5.

Masayuki Katagiri, Takashi Matsumoto, Hisao Miyazaki, Ryota Ifuku, Rika Matsumoto, Tadashi Sakai, and Akihiro Kajita "Resistivity Reduction of Multilayer Graphene Interconnects Prepared by Low-Temperature Chemical Vapor Deposition"; ADMETA plus 2015.

Mehta, Ruchit "Towards Integration of Graphene in Advanced CMOS Interconnect Technology"; PurdueUniversity ProQuest Dissertations & Theses, 2016. 10191315. Available online: [https://docs.lib.purdue.edu/cgi/viewcontent.cgi?article=2608&context=open_access_dissertations].

N Toyoda, I Yamada "Low Temperature Graphene Film Formation with Ethane Cluster Ion Implantation"; 2016 21st International

(56) References Cited

OTHER PUBLICATIONS

Conference on Ion Implantation Technology (IIT), 2016—ieeexplore.ieee.org. doi: 10.1109/IIT.2016.7882889.
P.O. Oviroh et. al."New development of atomic layer deposition: processes, methods and applications", Science and Technology of Advanced Materials, 20(1), 465-496. https://doi.org/10.1080/14686996.2019.1599694.
R Mehta, S Chugh, Z Chen "Transfer-free multi-layer graphene as a diffusion barrier"; Nanoscale, Issue 5, 2017—pubs.rsc.org. DOI:10.1039/C6NR07637H.
R Mehta, S Chugh, Z Chen "Enhanced electrical and thermal conduction in graphene-encapsulated copper nanowires"—Nano letters, 2015—ACS Publications; vol. 15/Issue 3: 2024-30. doi: 10.1021/nl504889t. Epub Feb. 6, 2015. PMID: 25650635.
Riteshkumar Vishwakarma, Rucheng Zhu, Amr Attia Abuelwafa, Yota Mabuchi, Sudip Adhikari, Susumu Ichimura, Tetsuo Soga, and Masayoshi Umeno "Direct Synthesis of Large-Area Graphene on Insulating Substrates at Low Temperature using Microwave Plasma CVD"; ACS Omega 2019, 4, 11263-11270. Available online: [https://pubs.acs.org/doi/epdf/10.1021/acsomega.9b00988?ref=article_openPDF].
Ryota Ifuku, Takashi Matsumoto, Tadashi Sakai,and Akihiro Kajita "Catalyst-free Growth of Graphene on 300mm Dielectric Substrate by Microwave Plasma-Enhanced Chemical Vapor Deposition at Low Temperatures"; ADMETA Plus 2017.
S Kataria, S Wagner, MC Lemme "Scalable Growth of Two-Dimensional Materials—a Prerequisite forProcess Integration"; ECS Transactions, 2017, vol. 80, No. 4—iopscience.iop.org; DOI:10.1149/MA2017-02/26/1154.
S. Cwik et al. "Thermal atomic layer deposition of ruthenium metal thin films using nonoxidative coreactants", J. Vac. Sci. Technol. A 38, 012402 (2020); https://doi.org/10.1116/1.5125109.
SS Pei, QK Yu, KP Huang, SR Xing "Synthesis of graphene and other 2D material: The past and future of chemical vapor deposition"; 2015 IEEE MTT-S International Microwave Workshop Series on Advanced Materials and Processes for RF and THz Applications (IMWS-AMP), 2015—ieeexplore.ieee.org; doi: 10.1109/IMWS-AMP.2015.7324942.
T Yamada, J Kim, M Ishihara "Low-temperature graphene synthesis using microwave plasma CVD"; Journal of Physics D: Applied Physics, 2013—iopscience.iop.org; DOI 10.1088/0022-3727/46/6/063001.
T Yamada, M Ishihara, J Kim, M Hasegawa, S Iijima "A roll-to-roll microwave plasma chemical vapordeposition process for the production of 294 mm width graphene films at low temperature"; Carbon, 2012; vol. 50, Issue 7, Jun. 2012, pp. 2615-2619—Elsevier; DOI: 10.1016/j.carbon.2012.02.020.
T Yamada, M Ishihara, M Hasegawa "Large area coating of graphene at low temperature using a roll-to-rollmicrowave plasma chemical vapor deposition"; Thin Solid Films, 2013—Elsevier; vol. 532, Apr. 1, 2013, pp. 89-93.
Taishi Ishikura, Atsunobu Isobayashi, Daisuke Nishide, Ban Ito, Tatsuro Saito, Takashi Matsumoto, Yuichi Yamazaki, Hisao Miyazaki, Masahito Watanabe, Naoshi Sakuma, Akihiro Kajita and Tadashi Sakai "Electrical Properties of 30 nm Width Bi-Layer Interconnects of Multi Layer Graphene and Ni"; IITC 2015.
Tao Liang, Yuhan Kong, Hongzheng Chen, and Mingsheng Xu "From Solid Carbon Sources to Graphene"; Chin. J. Chem. 2016, 34, 32-40. DOI: 10.1002/cjoc.201500429.
Tobias Weidner, Nirmalya Ballav, Ulrich Siemeling, Dennis Troegel, Tim Walter, Reinhold Tacke, David G. Castner, and Michael Zharnikov "Tripodal Binding Units for Self-Assembled Monolayers on Gold: A Comparison of Thiol and Thioether Headgroups"; J. Phys. Chem. C 2009, 113, 19609-19617. doi: 10.1021/jp906367t. PMID: 21625327; PMCID: PMC3102536.
Xi Wan, Kun Chen, Danqing Liu, Jian Chen, Qian Miao, and Jianbin Xu "High-Quality Large-Area Graphenefrom Dehydrogenated Polycyclic Aromatic Hydrocarbons"; Chem. Mater. 2012, 24, 3906-3915. dx.doi.org/10.1021/cm301993z.
Y. Kim, W. Song, S. Y. Lee, C. Jeon, W. Jung, M. Kim, and C.-Y. Park "Low-temperature synthesis of graphene on nickel foil by microwave plasma chemical vapor deposition"; Applied Physics Letters 98, 263106 (2011).
Yannic Falke, Boris V. Senkovskiy, Niels Ehlen, Lena Wysocki, Tomas Marangoni, Rebecca A. Durr, Alexander I. Chernov, Felix R. Fischer, and Alexander Grüneis "Photothermal Bottom-up Graphene Nanoribbon Growth Kinetics"; Nano Lett. 2020, 20, 4761-4767.
Yijun Zhang, Wei Ren, Zhuangde Jiang, Shuming Yang, Weixuan Jing, Peng Shi, Xiaoqing Wua and Zuo-(Guang Ye "Low-temperature remote plasma-enhanced atomic layer deposition of graphene and characterization of its atomic-level structure"; Mater. Chem. C, 2014, 2, 7570.
Yu Ding, Mengqi Zeng, Lei Fu "Low-temperature synthesis of sp2 carbon nanomaterials"; Science Bulletin 64 (2019) 1817-1829.
YZ Chen, H Medina, HW Tsai, YC Wang "Low temperature growth of graphene on glass by carbon-enclosed chemical vapor deposition process and its application as transparent electrode"; Chemistry of Materials, 2015; vol. 27/Issue 5—ACS Publications. DOI:10.1021/CM504431D.
Zhenlin Pei, Francky Catthoor, Zsolt Tokei, and Chenyun Pan "Beyond-Cu Intermediate-Length Interconnect Exploration for SRAM Application"; IEEE Transactions on Nanotechnology, pp. 367-373, 2022, doi: 10.1109/TNANO.2022.3157952.
Li Z, Wu P, Wang C, Fan X, Zhang W, Zhai X, Zeng C, Li Z, Yang J, Hou J. Low-temperature growth ofgraphene by chemical vapor deposition using solid and liquid carbon sources. ACS Nano. Apr. 26, 2011;5(4):3385-90. doi: 10.1021/nn200854p. Epub Mar. 29, 2011. PMID: 21438574.
Shishir Kumar et al. Low Temperature Graphene Growth. 2009 ECS Trans. 19 175. DOI 10.1149/1.3119541.
Hesari, Mahdi, et al., "Covalent modification of graphene and micro-diamond with redox active substrates via photogenerated carbenes". Carbon vol. 85, Apr. 2015, pp. 159-167. https://doi.org/10.1016/j.carbon.2014.12.053.
Zhao, Xin-Jing, et al., "Molecular defect-containing bilayer graphene exhibiting brightened luminescence". Sci. Adv. 2020; 6eaay8541, Feb. 28, 2020, pp. 1-6. doi: 10.1126/sciadv.aay8541. PMID: 32158946; PMCID: PMC7048428.

* cited by examiner

GRAPHENE COATED METALLIC SURFACES, DEVICES AND METHOD OF MANUFACTURE THEREOF

CROSS REFERENCE TO RELATED APPLICATIONS

This application is a National Phase of PCT Patent Application No. PCT/IL2022/051010 having International filing date of Sep. 20, 2022, which claims the benefit of priority of U.S. Provisional Patent Application No. 63/245,956, filed Sep. 20, 2021, the contents of which are all incorporated herein by reference in their entirety.

TECHNICAL FIELD

The present invention relates to coating and layer structures. In particular, the invention relates to coating of surfaces by carbon allotropes and layer structures comprising carbon allotropes, in particular graphene and devices containing them.

BACKGROUND ART

Advanced coating has played a significant role in advancing material technologies in the last decades, whether it is in the development of harder coating or low friction coating, optical coating or electrically conducting coatings. The development has been in many cases advanced by the development of new materials, new methods of coating and more complex arrangements of layer structures to achieve a device purpose. Coating has advanced to achieve functional targets by improving physical properties, e.g., forming an advanced layer structure arrangement to provide high electrical conductivity, or by enabling intricate device manufacturing, e.g., miniaturization of integrated circuit elements.

The systematic miniaturization of integrated digital electric circuits elements was and is the main driving force of very large system integration (VLSI) in semi-conductor devices over the past five decades. Smaller transistors were translated to higher density of circuit elements per area, to lower power consumption and to faster clock rates. On the other hand, as result of scaling down interconnection metal lines have lower conductivity, or increased energy consumption. For example, in modern computer processor the energy losses on interconnections amounts to about 60% of the total dynamic power consumption of the processor. Yet, interconnections are aggressively scaled at every technology generation and are the pillars sustaining the increased circuit density. Moreover, in concurrent technology generations (2020), signal transmission delay of 1 mm-long global interconnect is expected to be larger by factor of 40 times than the transistor gate intrinsic delay time.

Interconnects in semi-conductor circuit manufacturing, connect between logic units. Interconnects are typically design as a multi-layered net. Whereas the layers of the interconnect net are built successively. Interconnects at the lower levels, closer to the logic elements are finer and typically connect individual or few logic elements while higher level interconnects generally connect more and more complex logic units, comprised of larger sets of logic elements. The latter are conceptually and practically coarser, forming connections over longer ranges.

Interconnects and vias are made in several repeating manufacturing steps (or "levels") which are similar but not necessarily the same. Vias are microscopic or nanoscopic conductive "columns" formed through different layer-structures (an arrangement of several layers of different materials). At the first layer-structure proximal to the wafer, vias connect to single logic elements, while at distal levels (further from the layer of the logic units) vias may form connections between interconnects at different levels.

The process comprises generally repeated steps of forming a set of dielectric layers, forming vias to the interconnect layers below and forming interconnects in the specific "level". The basic process of forming an interconnect layer comprises four basis steps. (i) Forming a dielectric (nonmetallic) layer-structure (one or more layers of different dielectrics), (ii) forming a pattern (e.g. by etching according to a photoresist mask), (iii) forming vias and interconnects therein according to the pattern (e.g., etching, sputtering TaN, 'seed' plating and electroplating with the metal), and (iv) preparing the top surface of the layer-structure, which comprises the interconnects, for the next step, e.g., by Chemical Mechanical Polishing (CMP).

Consider copper interconnects as an illustrative example. In general, electron propagation in metallic media is well described by models of (nearly) free electron gas, describing the conductivity as proportion of the time passing between two scattering events where electrons are free to propagate without disturbance, and passing a distance termed mean free path. Specifically, the mean free path of copper at room temperature is about 40 nm and is already comparable to the pitch size of interconnections of 22 nm technology. When current carrying wire is scaled to its mean free path, the effects of electron scattering from the wire boundaries become increasingly more significant and the resistivity shoots up rapidly. Additional issues with smaller dimension metal interconnects are also evident with copper interconnects. Copper is a highly diffusive material that easily penetrates silicon and dielectrics which are used to separate the different layers of circuit elements (e.g., transistors) and interconnects. This diffusion of metal atoms may cause degradation, resulting, inter alia, in leakage and short paths across dielectrics, formation of deep level traps that enhance leakage currents at p-n junctions, and degradation of minority carrier lifetime that limit the effectiveness of electronic devices.

Therefore, it is imminent to apply a coating on metal interconnection lines (copper as an illustrative example) that would prevent the diffusion of metal atoms into the silicon and dielectrics around it. In conventional interconnection technologies, a layer of TaN serves as the standard diffusion barrier that also features chemical stability and conformal coating at reduced dimensions. The main disadvantage of TaN coatings is its high electrical resistivity, typically in the range of 100 to 400 μΩcm. In addition, it should be noted that features formed through the deposition of a TaN diffusion barrier layer cannot be scaled down in proportion to the reduced cross-sectional area of respective metal conductor interconnects. Consequently, the resistive surface diffusion barrier consumes an increasingly more dominant surface skin on the metal at higher technology generations.

Reliability of such of metal (copper) interconnections may be quantified by the respective mean time to fail ("lifetime") which is dominantly affected by electromigration resulted failure. As described for example in M. R. Baklanov, C. Adelmann, L. Zhao, and S. De Gendt, "Advanced Interconnects: Materials, Processing, and Reliability," ECS Journal of Solid State Science and Technology, vol. 4, no. 1, pp. Y1-Y4, and in references therein, and in G. C. Shwartz, Handbook of semiconductor interconnection technology. CRC Press, 2006, electromigration is caused by transfer of linear momentum from electrons moving under strong electric fields to the metal atoms, driving their migration along the direction of electrical current flow. Consequently, copper interconnection lines become thinner "upstream" and thicker "downstream" along the electrical current path—resulting in increased electrical resistance at thinner regions and in increased mechanical strain at the thicker regions. Eventually, the thinner points of reduced cross-sectional area feature high resistance and thus develop increasingly higher temperatures that drive electromigration even faster with positive feedback ending in failure due to metal voids and open circuit breakdown. Electromigration, therefore, puts a limit on the maximal current density driven on the metal wire, per a defined reliability (mean time to fail—MTTF).

There is a need to for better diffusion barrier materials that may provide better conductivity.

More recently, the emergence on new electronic materials such as graphene has shown potential for use as diffusion barriers in integrated interconnections and as two dimensional electric and thermal conductive layer on surfaces. See for example: R. Mehta et al. *Nanoscale,* 2017, 9, 1827-1833, R. Mehta, et al. *Nano letters,* 2015, 15, 2024-2030 and M. Stelzer et al. *EEE Journal of the Electron Devices Society,* 2017, 5, 416-425. However, crucial obstacles still prevent industrial application of graphene as a new type of diffusion barrier, mainly in the step of in situ graphene synthesis and non-satisfactory properties of the product.

Alternative non-limiting examples of area in which advanced coating with carbon allotropes and, in particular, with graphene, have been considered, including the use of graphene coating as permeation barrier, a lubricant, light collector, transparent electrode and more.

SUMMARY OF INVENTION

Technical Problem

The aim of the invention is to provide a method for forming a graphene coating or a graphene patterned coating on a metallic surface and, in particular, on an interconnect. The aim of the invention according to certain aspects is to provide a method for forming an effective diffusion barrier on top of a metal interconnect that is thin and more conductive, targeting improved reliability of the interconnect in particular and of a device comprising the interconnect in general. In addition to improved conductivity, improved reliability requires the following conditions: (i) good thermal and chemical stability; (ii) good thermal conductivity; (iii) good adhesion or bonding to the target metal wherein target metal would typically be copper, aluminum, nickel alloy, ruthenium or gold, though other metals may be appropriate as well; and (iv) fast, void-free, wafer-scale, high-yield deposition method. In addition, as will be elaborated below the coating may be prepared to enable overcoating with an additional layer which may be a metal layer deposition or a non-metal layer deposition.

According to a further aspect, an aim of the invention is to provide a method for forming diffusion barrier on top of a metal surface that may be formed and shaped in dimensions that are in proportion with respective metal interconnects that, in turn, may be formed in coordinated manufacturing steps.

A further aim of the invention is to provide a protective coating and to provide a method of producing a graphene layer that will keep the metallic layer or substrate intact, serving as a diffusion barrier and/or providing mechanical protection to the metallic substrate.

According to an aspect of the invention a method is disclosed for the deposition of a graphene diffusion barrier in between a metal conductor (e.g., copper) and a (non-metallic) dielectric layer and, providing for high conductivity and improved barriers between the metallization layers (i.e., the metal interconnects) and the (non-metallic) dielectric. As such, the method provides for continuing the progress of semiconductor integrated circuit technology. A further advantage of the forming of graphene layers as diffusion barrier coating on top of a metal interconnect is their superior metal diffusion blocking capability which has been demonstrated for copper. Thus, providing a highly conductive diffusion barrier layer according to the invention, enables driving higher currents through an interconnection section without passing the maximal current density driven through the metal wire, per the defined reliability.

The invention further aims to provide a method for localized forming and shaping of the graphene diffusion barrier coatings to form graphene diffusion barrier regions and enabling shaping of diffusion barrier regions on top of metal interconnects and in proportional dimensions in coordinated manufacturing steps.

Solution to Problem

In a first aspect the invention provides a method for coating a metal surface with graphene comprising the steps of:

obtaining a metal having a surface;

obtaining a first graphene molecular precursor comprising at least one compound selected from the group consisting of:

compound A having molecular formula I $$G-X_i^1Y_m^1Y_n^2, \text{ and} \qquad \text{formula I}$$

compound B having molecular formula II $$G-X_i^1X_j^2Y_m^1Y_n^2 \qquad \text{formula II}$$

G is a $C_6$-$C_{100}$ hydrocarbon component optionally comprising heteroatoms; $X^1$ is a tethering group to the surface of the metal material, $X^2$ is selected from at least one of: a tethering group to a graphene surface ($X^{2G}$), a tethering group to a metal layer ($X^{2m}$), and a tethering group to a non-metal layer ($X^{2n}$); $Y^1$, $Y^2$ are independently selected from the group consisting of hydrogen, halogen radical and —COOH and i, j, m and n are independent integer numbers having a value selected between 1 and 20;

depositing said first graphene molecular precursor on top of the metal surface to obtain a surface at least partially coated with the at least one graphene molecular precursor and bound to the at least one graphene molecular precursor; and transforming the deposited first graphene molecular precursor into a surface bound graphene interfacial layer, to obtain a graphene coated metal surface comprising a graphene interfacial layer bound to the surface of the metal.

In a second aspect the invention provides a graphene coated metal comprising a covalent bond between the graphene coating and a surface of the metal.

In a third aspect, the invention provides a device comprising the aforementioned graphene coated metal.

In a fourth aspect the invention provides a compound having formula I, formula II formula IV or formula VI as described hereinbelow for use as a component in a graphene molecular precursor.

Advantageous Effects of Invention

As noted in the above reference, graphene quality and growth temperature are the important requirements for efficient forming of graphene barriers for metal conductors such as copper. As is demonstrated in the examples hereinbelow, the method according to the invention provides for forming high graphene quality at relatively low growth temperature and a mechanically robust coating layer that will provide stability to a complex layer structure withstanding standard peeling tests. According to some embodiment of the invention the method is performed at relatively low effective temperature range and provides for controlled graphene quality and controlled wafer temperature. According to the invention a graphene diffusion barrier is formed on top of the metal by polymerization of novel precursors that bond to the metallic surface. Polymerization of the precursors may be heat assisted and performed at elevated temperatures (yet at lower temperatures compared to other graphene production techniques) and may additionally or alternatively initiated and controlled by laser. According to an aspect of the invention bonding between the different layers or coatings prevents peeling off (or flaking) of the different layers or coatings.

BRIEF DESCRIPTION OF THE DRAWINGS

For better understanding of the present invention and in order to exemplify how it may be implemented in practice, several embodiments are hereby described, which should be interpreted only as non-limiting examples, with reference to the accompanying figures. It is noted that the sizes and scale of the embodiments presented in the figures are exemplary and non-limiting.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein.

DESCRIPTION OF EMBODIMENTS

Figure 1:
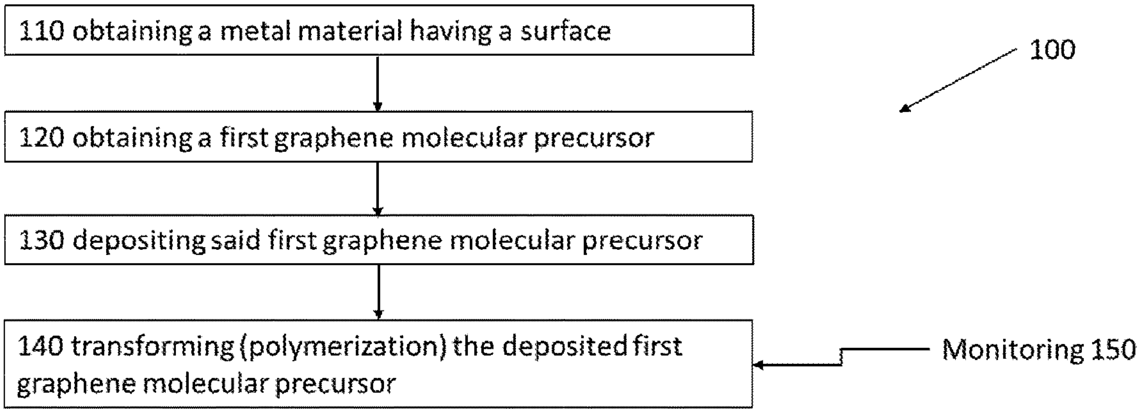
FIG. 1 depicts a block diagram representing a general method for forming a graphene interfacial layer or coating on a metallic surface according to an embodiment of the invention.
Figure 2:
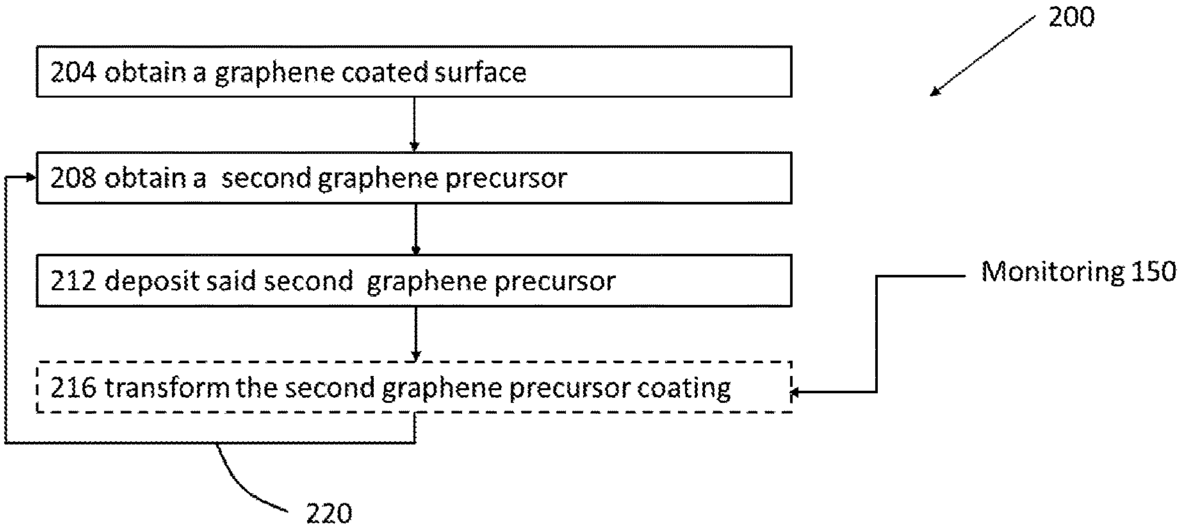
FIG. 2 depicts a block diagram representing a general method for forming a second graphene coating on a graphene coated metallic surface and optionally repeating the process according to some embodiments of the invention.

Although the invention is illustrated and described herein as embodied in FIGS. 1 to 3 and examples 1 to 8, the invention is not limited to the details shown because various modifications and structural changes may be made without departing from the invention and the equivalents of the claims. However, the compositions construction and method of production or operation of the invention together with additional objects and advantages thereof will be best understood from the following description of specific embodiments when read in connection with the accompanying drawings.

According to a first aspect the present invention provides a method for coating a metallic surface with graphene coating and provides for a device comprising a metallic surface coated with a graphene coating.

Referring to FIG. 1 a general method for forming a graphene film on a metallic surface and optional forming of a diffusion barrier coating on top of interconnections according to an aspect of the invention is disclosed. According to embodiments of the invention the method comprises obtaining a metal material having a surface (step 110), and obtaining a first graphene molecular precursor comprising at least one compound selected from the group consisting of compound A having molecular formula I $$G-X_i^1Y_m^1Y_n^2, \text{ and} \qquad \text{formula I}$$

and compound B having molecular formula II $$G-X_i^1X_j^2Y_m^1Y_n^2 \qquad \text{formula II}$$

wherein G is a $C_6$-$C_{100}$ aromatic hydrocarbon component, $X^1$ is a tethering group to the surface of the metal material, $X^2$ is selected from at least one of: a tethering group to a graphene surface $X^{2g}$, a tethering group to a metal layer $X^{2m}$, and a tethering group to a non-metal layer $X^{2n}$, $Y^1$, $Y^2$ are independently selected from the group consisting of hydrogen, a halogen radical, an acidic functional group (A), a basic functional group (B) or combination thereof and i, j, n, and m are independent integer numbers having a value selected between 1 and 20 (step 120). The values for i, m and n in formula II are independent from the values for i, m and n in formula I.

The term "graphene" refers an allotrope of carbon consisting of a single layer in which carbon atoms are generally connected by $sp^2$ bonds and forming a 'honeycomb' arrangement. The graphene may be contaminated, e.g. have up to 10^10 heteroatoms per $cm^2$, with hetero-atoms such as Si, S, N, Zn, O, Ge or Sn. Hydrogen atoms may be covalently bonded to the peripheral carbon atoms consisting of the single layer or alternatively be replaced by functional groups which in turn may covalently connect the graphene layer to adjacent surfaces. These functional groups and contaminations together with other defects may in general form a small percent of defects in the graphene idealized structure and aromatic character without significantly changing its conductivity or ability to form a diffusion barrier.

The term "defect" as used herein means a disruption in the normal structure the graphene lattice and includes disruption of the ideal extended pi-bonded network. This includes an absence of a carbon atom in the graphenic lattice, presence of $sp^3$ bound carbons in the graphene network instead of $sp^2$ bound carbon atoms, which may be caused by breaking of a C—C bond, the change of conjugation of a C—C bond, intentional introduction of functional groups as part of the present invention and/or any other changed hybridization state of a carbon atom (from $sp^2$ to $sp^3$ hybridization). Defects also includes any other form of disruption of the ideal extended pi-bonded network such as (i) disposition, e.g., the formation of localized heptagon-pentagon carbon bond formation or region discontinuities or (ii) interstation, e.g., the replacement of a carbon atom with a nitrogen atom in the graphene lattice. The singular form "defect" refers to such a change occurring in one location of the graphene lattice.

The term "molecular precursor" refers to a compound that participates in a chemical reaction that produces another compound. Specifically, the term "graphene molecular precursor" refers to compound that after reaction, their main carbohydrate backbone become part of a graphene coating, film or layer.

The component G is the building block of the graphene to be. It is made of an aromatic carbon skeleton which may be small aromatic molecules such as benzene or consisting of several aromatic rings fused to each other (polycyclic aromatic hydrocarbons). The method according to the invention may employ different graphene molecular precursors having different shapes, in attempt to provide high graphene coverage with a minimal number of defects (e.g., voids) in the two-dimensional graphene coating. After their deposition on the surface these building block will later on form during a transformation step, e.g., by radiation or by maintaining elevated temperature in the reaction chamber, carbon-carbon bonds between them to generate the two-dimensional graphene network.

According to some embodiments G is a $C_{10}$-$C_{100}$ polycyclic aromatic hydrocarbon (PAH), optionally comprising heteroatoms selected from silicon, germanium, zinc, sulfur, nitrogen and oxygen. In some embodiments G is selected from the group consisting of rubrene, coronene, p-hexabenzocoronene, hexa-cata-hexabenzocoronene, pentacene, hexaphenylbenzene, perylene, chrysene, pyrene, PAHs of compounds IV-VIII or combinations thereof.

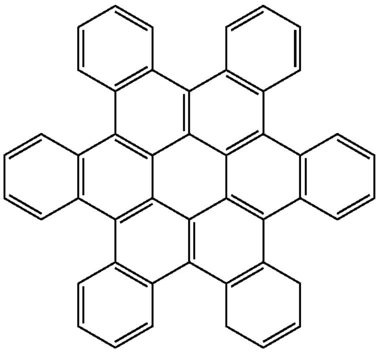

Hexa-cata-hexabenzocoronene

-continued

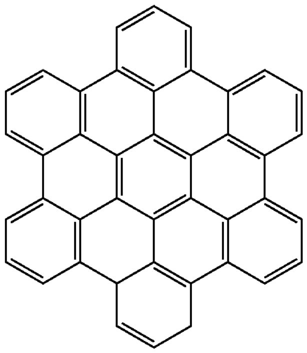

p-hexabenzocoronene

IV

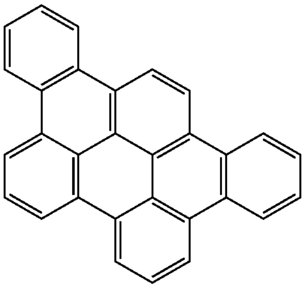

V

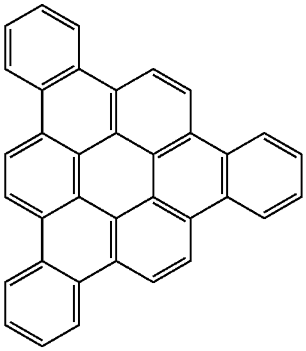

VI

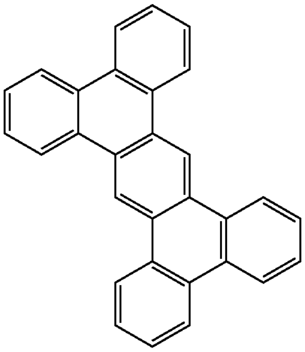

-continued

VII

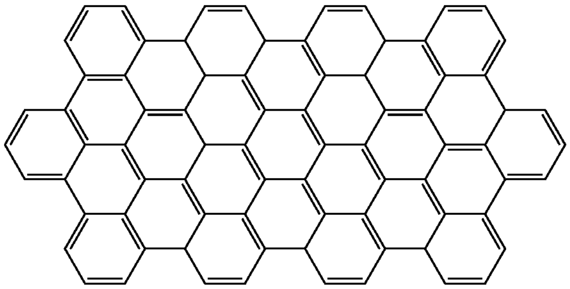

VIII

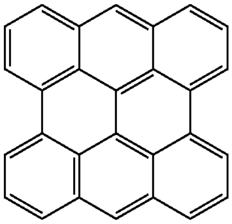

According to some embodiments the metal material is copper or aluminum. According to some embodiments the metal material is one of aluminum, ruthenium, gold, nickel, palladium, molybdenum or cobalt or alloys thereof. It will be clear to a person skilled in the art that with the appropriate selection of the first graphene molecular precursor, practically any metal can be selected. In some embodiments the metal material is selected only from copper. In some embodiments the metal material is selected only from aluminum. In some embodiments the metal material is selected only from copper or aluminum.

The term "tethering group" refers in the context of the invention to a functional group which is capable of forming a bond (e.g., covalent bond) by means of a chemical reaction with molecular entities being part of a metallic or non-metallic surface. The formation of the covalent bond results in the covalent bonding between the molecule which comprises the tethering group (e.g., the graphene molecular precursor) and the surface (e.g., the metallic or non-metallic surface).

According to some embodiments, $X^1$ is a metal tethering group, i.e., a functionalized tethering group that is tailored to connect a graphene precursor to a surface of a metal material by a covalent bond. According to such embodiments, $X^1$ is selected from the group consisting of —$R^1COOR^2$, —$R^1SO^3R^2$, —$R^1PO_3H^2$, —$R^1COH$, —$NR^3R^4$ and —$R^1SH$ wherein $R^1$ is selected from a bond or $C_{1-8}$ saturated or unsaturated, substituted or unsubstituted alkyl; $R^2$ is selected from H or $C_{1-8}$ saturated or unsaturated, substituted or unsubstituted alkyl, $R^3$ and $R^4$ are independently selected from H, $C_{1-8}$ saturated or unsaturated optionally derivatized alkyl. When the metal to be coated is titanium then $X^1$ may further be selected from —$R^1SiOH$ and $R^1SiCl_3$. In this regard, it is noted that the selection of the tethering group $X^1$ may take into consideration the affinity of a functional group to the specific metal to be coated.

According to some embodiments, $X^2$ is $X^{2G}$ a graphene tethering group, i.e., a functionalized tethering groups that is tailored to connect a graphene precursor to a surface of a graphene layer or to a tethering group of a compound of an adjacent graphene molecular precursor or a tethering group embedded in a graphene layer by a covalent bond or pi-interaction. According to such embodiments, $X^{2G}$ is selected from the group consisting of $C_6$-$C_{20}$ aryl unsubstituted or substituted by an electron withdrawing group, $C_6$-$C_{20}$ substituted or unsubstituted heteroaryl, —$R^1SiOH$, $R^1SiCl_3$, —$R^1X$, —$NR^3R^4$, —$R^1COOH$, —$R^1SO_3R^2$, and —$R^1PO_3H_2$, wherein $R^1$ is selected from a bond, $C_{1-8}$ saturated or unsaturated, substituted or unsubstituted alkyl, X is selected from —OH, —Cl, —Br, —F, or —I, $R^3$ and $R^4$ are independently selected from H, $C_{1-8}$ saturated or unsaturated optionally derivatized alkyl.

According to some embodiments, the electron withdrawing group is selected from the group consisting of a halide, —CN, —$NO_2$, —CHO, —$COOR^2$, —C(═O) $R^5$ wherein $R^2$ is H or $C_{1-8}$ saturated or unsaturated, substituted or unsubstituted alkyl $R^5$ is $C_{1-8}$ saturated or unsaturated, substituted or unsubstituted alkyl.

For example, a graphene tethering group of a first graphene molecular precursor can be an acidic functional group. This acidic group may react with a basic functional group of a compound of a second graphene molecular precursor which is deposited on top of the previously formed graphene coating (that was formed from the first graphene molecular precursor) to form a bond (e.g., amid bond between an amine and a carboxylic acid).

In another example a graphene tethering group off a first graphene molecular precursor can be a silicon halide group (e.g., trichlorosilyl), which may react with a silanol functional group of a compound of a second graphene molecular precursor which is deposited on top of the previously formed graphene coating (that was formed from the first graphene molecular precursor) to form a siloxane bond.

According to some embodiments $X^2$ is $X^{2N}$ a non-metal tethering group, i.e., a functionalized tethering groups that is tailored to connect a graphene precursor to a surface of a non-metal layer by a covalent bond. According to such embodiments $X^{2N}$ is selected from the group consisting of $C_{1-8}$ siloxyl, —$R^1SO_3R^2$, —$R^1PO_3H_2$, —$SiR^1R^2R^3$, —$NR^4R^5$, —$R^5COOR^6$ and $R^7SH$ wherein $R^1$, $R^2$, and $R^3$ are independently selected from H, —OH, —Cl, —Br, —F, —I, $C_{1-8}$ saturated or unsaturated optionally derivatized alkyl, and at least one of $R^1$, $R^2$, and $R^3$ is —Cl, —Br, —F or —I; $R^4$ and $R^5$ are independently selected from H, $C_{1-8}$ saturated or unsaturated optionally derivatized alkyl; $R^6$ is H or $C_{1-8}$ saturated or unsaturated optionally derivatized alkyl; $R^7$ is a bond or $C_{1-8}$ saturated or unsaturated optionally derivatized alkyl.

The formation of the carbon-carbon bonds between the graphene molecular precursors can be assisted by having the aromatic skeleton (G) bear good leaving functional groups as the $Y^1$ and $Y^2$ groups on the periphery of the G component. For example, $Y^1$ can be a halide such as —Cl or —Br and $Y^2$ can be —H, such that when the graphene precursor coating is transformed a halide from one graphene molecular precursor and a hydrogen from another graphene precursor would leave as HCL or HBr and the two graphene molecular precursors would form a carbon-carbon bond. In another example, $Y^1$ can be —Cl and radiation of the graphene molecular precursor film generates carbon-carbon bonds between two carbons (which were linked to —Cl) of two adjacent (same or different) graphene molecular precursor molecules and a $Cl_2$ molecule is generated.

In some embodiments $Y^1$ and $Y^2$ can be acidic and basic groups, respectively in order to design the orientation of the graphene molecular precursors with respect to each other, for example that a side bearing acidic functional groups would face a side bearing basic functional groups of another molecule. The basic and acidic functional groups can be on the same molecule (e.g., on different sides of the periphery of the carbon skeleton) or there may a mixture of two different graphene molecular precursors, one bearing acidic functional groups and the other bearing basic functional groups.

According to some embodiments compound A (having formula I: G-$X^1_iY^1_mY^2_n$) is selected from: tetrakis(mercaptomethylene)rubrene, tetrakis(mercaptoethylene)rubrene, bis(mercaptoethylene)rubrene, mercaptorubrene, rubrene-carboxylic acid memrcaptodichlororubrene, dimercaptorubrene, trimercaptorubrene, tetramercaptorubrene, tetrakis (mercaptomethylene)dichlororubrene, bis(mercaptomethylene)rubrene, bis(mercaptomethylene)dichlororubrene, tetrakis(mercaptoethylene)dichlororubrene, bis(mercaptoethylene)dichlororubrene, mercaptocoronene, mercaptodichlorocoronene, mercaptodibromocoronene, mercaptotetrachlorocoronene, mercaptotetrabromocoronene, dimercaptocoronene, dimercaptodichlorocoronene, dimercaptodibromorocoronene, dimercaptotetrabromocoronene, trimercaptotetrachlorocoronene, tetramercaptocoronene, tetramercaptodibromocoronene, tetramercaptotetrabromocoronene, mercaptomethylenecoronene, bis (mercaptomethylene)dichlorocoronene, bis(mercaptomethylene)coronene, bis(mercaptomethylene)dibromocoronene, bis(mercaptomethylene)tetrachlorocoronene, bis(mercaptomethylene)tetrabromocoronene, bis(mercaptomethylene)hexachlorocoronene, bis(mercaptomethylene)tetrabromocoronene, bis(mercaptomethylene)hexabromocoronene, tris(mercaptomethylene)coronene, tris(mercaptomethylene)tetrachlorocoronene, tris(mercaptomethylene)tetrabromocoronene, tetrakis(mercaptomethylene)coronene, tetrakis(mercaptomethylene)dichlorocoronene, tetrakis (mercaptomethylene)dibromocoronene, tetrakis(mercaptomethylene)tetrachlorocoronene, tetrakis(mercaptomethylene)tetrabromocoronene, tetrakis(mercaptomethylene) hexachlorocoronene, tetrakis(mercaptomethylene) hexabromocoronene, dimercaptotetrachlorocoronene, trimercaptocoronene, trimercaptotetrabromorocoronene, tetramercaptodichlorocoronene, tetramercaptotetrachlorocoronene, hexamercaptocoronene, mercaptoethylenecoronene, bis(mercaptoethylene)coronene, tetrakis(mercaptoethylene)coronene, tris(mercaptoethylene)coronene, tetrakis (mercaptomethylene)dichlorohexabenzocoronene, tetrakis (mercaptomethylene)tetrachlorohexabenzocoronene, tetrakis(mercaptomethylene)dibromohexabenzocoronene, tetrakis(mercaptomethylene)tetrabromohexabenzocoronene, coronene-carboxylic acid, tetrakis(p-mercaptomethylenephenyl)-bis(tetra)chlorophenylbenzene, hexakis(p-mercaptomethylene-m,m'-dichlorophenyl)benzene, hexakis(p-mercaptomethylene)benzene, hexakis(p-mercaptoethylene) benzene, hexakis(p-mercaptomethylene-m,m'-dibromophenyl)benzene, bis(p-mercaptomethylenephenyl)-tetrakis(tetrachlorophenyl)benzene, tetra(p-benzoic acid)-diphenylbenzene, mercaptopyrene, mercaptotetrachloropyrene, mercaptotetrabromopyrene, mercaptomethylenepyrene, mercaptomethylenetetrachloropyrene, mercaptomethylenetetrabromopyrene, mercaptoethylenetetrachloropyrene, mercaptoethylenetetrabromopyrene, mercaptoethylenepyrene, pyrene-carboxylic acid. It is noted that the scope of the invention is not restricted to specific positions of the functional groups on the aromatic skeleton of each exemplary molecule.

In some embodiments, Compound A (having formula II G-$X^1_iY^1_mY^2_k$) of the graphene molecular precursor is selected from compounds I, II and mixtures thereof:

(I)

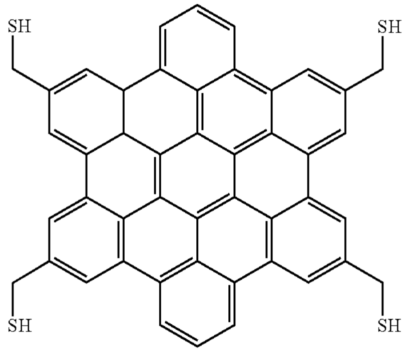

(II)

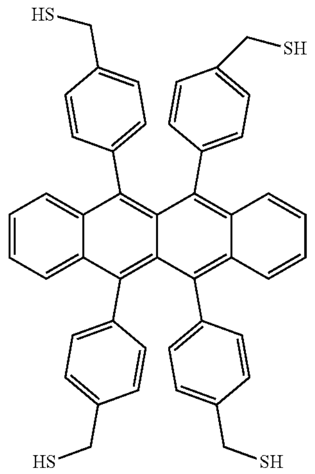

According to some embodiments compound B (having formula II: G-$X^1_iX^2_jY^1_mY^2_k$) bears tethering groups to a non-metal surface when $X^2$ is $X^{2N}$ and is selected from: bis(mercaptomethylene)-bis(triclorosilyl)rubrene, mercaptomethylene-trichlorosilylrubrene, bis(mercaptoethylene)-bis(triclorosilyl)rubrene, mercaptoethylene-triclorosilylrubrene, mercapto-bis(triclorosilyl)rubrene, mercapto-trichlorosilyl-dichlororubrene, dimercapto-trichlorosilyl-rubrene, trimercaptotrichlorosilylrubrene, tetramercapto-trichlorosilylrubrene, bis(mercaptomethylene)-bis(trichlorosilyl)-dichlororubrene, mercaptomethylene-trichlorosilyl-dichlororubrene, bis(mercaptoethylene)-bis(trichlorosilyl)-dichlororubrene, mercaptoethylene-trichlorosilyl-dichlororubrene, mercapto-trichlorosilylcoronene, mercapto-bis(triclorosilyl)-dichlorocoronene, mercapto-bis(triclorosilyl)-dibromocoronene, mercapto-bis(triclorosilyl)-tetrachlorocoronene, mercapto-bis(triclorosilyl)-tetrabromocoronene, dimercapto-bis(triclorosilyl)coronene, dimercapto-bis(triclorosilyl)dichlorocoronene, dimercapto-bis (triclorosilyl)-dibromorocoronene, dimercapto-bis(triclorosilyl)-tetrachlorocoronene, dimercapto-bis(triclorosilyl) tetrabromocoronene, trimercapto-bis(triclorosilyl)-coronene, trimercapto-bis(triclorosilyl)tetrachlorocoronene, trimercapto-bis(triclorosilyl)tetrabromorocoronene, tetramercapto-bis(triclorosilyl)coronene, tetramercapto-bis(triclorosilyl)dichlorocoronene, tetramercapto-bis(triclorosilyl) dibromocoronene, tetramercapto-bis(triclorosilyl)tetrachlorocoronene, tetramercapto-bis(triclorosilyl)-tetrabromocoronene, pentamercapto-trichlorosilylcoronene, mercaptomethylene-bis(triclorosilyl)coronene, bis(mercaptomethylene)-bis(triclorosilyl)coronene, bis(mercaptomethylene)-bis(triclorosilyl)dichlorocoronene, bis(mercaptomethylene)-bis(triclorosilyl)dibromocoronene, bis(mercaptomethylene)-bis(triclorosilyl)-tetrachlorocoronene, bis (mercaptomethylene)-bis(triclorosilyl)tetrabromocoronene, bis(mercaptomethylene)-bis(triclorosilyl)hexachlorocoronene, bis(mercaptomethylene)-bis(triclorosilyl)tetrabromocoronene, bis(mercaptomethylene)-bis(triclorosilyl)hexabromocoronene, tris(mercaptomethylene)-bis(triclorosilyl) coronene, tris(mercaptomethylene)-bis(triclorosilyl)-tetrachlorocoronene, tris(mercaptomethylene)-bis(triclorosilyl)-tetrabromocoronene, tetrakis(mercaptomethylene)-bis(triclorosilyl)coronene, tetrakis(mercaptomethylene)-bis (triclorosilyl)-dichlorocoronene, tetrakis(mercaptomethylene)-trichlorosilyl-dibromocoronene, tetrakis(mercaptomethylene)-trichlorsilyl-tetrachlorocoronene, tetrakis(mercaptomethylene)-trichlorosilyl-tetrabromocoronene, tetrakis (mercaptomethylene)-trichlorosilyl-hexachlorocoronene, tetrakis(mercaptomethylene)-trichlorosilyl-hexabromocoronene, mercaptoethylene-trichlorosilylcoronene, bis(mercaptoethylene)-trichlorosilylcoronene, tris(mercaptoethylene)-trichlorosilylcoronene, tetrakis(mercaptoethylene)-trichlorosilylcoronene, tetrakis(mercaptomethylene)-trichlorosilyl-dichlorohexabenzocoronene, tetrakis(mercaptomethylene)-trichlorsilyl-tetrachlorohexabenzocoronene, tetrakis(mercaptomethylene)dibromohexabenzocoronene, tetrakis(mercaptomethylene)tetrabromohexabenzocoronene, bis(p-mercaptomethylenephenyl)-bis(p-trichlorosilyl)-bis(tetrachlorophenyl)benzene, tetrakis(p-mercaptomethylene-m,m'-dichlorophenyl)-bis (trichlorosilylphenyl)benzene, tetrakis(p-mercaptoethylene)-bis(p-trichlorosilyl)benzene, bis(p-mercaptomethylenephenyl)-tetrakis(tetrachlorophenyl)benzene, mercaptotrichlorosilylpyrene, mercapto-trichlorosilyl-tetrachloropyrene, mercapto-trichlorosilyl-tetrabromopyrene, mercapto-trichlorosilyl-methylenepyrene, mercapto-trichlorosilyl-methylenetetrachloropyrene, mercaptomethylene-trichlorosilyl-tetrabromopyrene, mercaptoethylene-trichlorosilyl-tetrachloropyrene, mercaptoethylene-trichlorosilyl-tetrabromopyrene, mercaptoethylene-trichlorosilylpyrene.

According to some embodiments compound B (having formula II: G-$X^1_iX^2_jY^1_mY^2_k$) bears tethering groups to graphene surface when $X^2$ is $X^{2G}$ and is selected from: bis(mercaptomethylene)trichlorosilylrubrene, mercaptomethylene-trichlorosilylrubrene, bis(mercaptoethylene)-bis (triclorosilyl)rubrene, mercaptoethylene-triclorosilylrubrene, mercapto-bis(triclorosilyl)rubrene, mercapto-trichlorosilyl-dichlororubrene, dimercapto-trichlorosilyl-rubrene, trimercaptotrichlorosilylrubrene, tetramercapto-trichlorosilylrubrene, bis(mercaptomethylene)-bis (trichlorosilyl)-dichlororubrene, mercaptomethylene-trichlorosilyl-dichlororubrene, bis(mercaptoethylene)-bis (trichlorosilyl)-dichlororubrene, mercaptoethylene-silanol-dichlororubrene, bis(mercaptomethylene)-silanolrubrene, mercaptomethylene-silanolrubrene, bis(mercaptoethylene)-bis(triclorosilyl)rubrene, mercaptoethylene-silanolrubrene, mercapto-bis(triclorosilyl)rubrene, mercapto-silanol-dichlororubrene, dimercapto-silanol-rubrene, trimercaptosilanol-rubrene, tetramercapto-silanolrubrene, bis(mercaptomethylene)-bis(silanol)-dichlororubrene, mercaptomethylene-silanol-dichlororubrene, bis(mercaptoethylene)-bis(silanol)-dichlororubrene, mercaptoethylene-silanol-dichlororubrene, mercapto-trichlorosilylcoronene, mercapto-bis(triclorosilyl)-dichlorocoronene, mercapto-bis(triclorosilyl)-dibromocoronene, mercapto-bis(triclorosilyl)-tetrachlorocoronene, mercapto-bis(triclorosilyl)-tetrabromocoronene, dimercapto-bis(triclorosilyl)coronene, dimercapto-bis(triclorosilyl)dichlorocoronene, dimercapto-bis(triclorosilyl)-dibromorocoronene, dimercapto-bis(triclorosilyl)-tetrachlorocoronene, dimercapto-bis(triclorosilyl)tetrabromocoronene, trimercapto-bis(triclorosilyl)-coronene, trimercapto-bis(triclorosilyl)tetrachlorocoronene, trimercapto-bis(triclorosilyl)tetrabromorocoronene, tetramercapto-bis (triclorosilyl)coronene, tetramercapto-bis(triclorosilyl) dichlorocoronene, tetra mercapto-bis(triclorosilyl) dibromocoronene, tetramercapto-bis(triclorosilyl) tetrachlorocoronene, tetramercapto-bis(triclorosilyl)-tetrabromocoronene, pentamercapto-trichlorosilylcoronene, mercaptomethylene-bis(triclorosilyl)coronene, bis(mercaptomethylene)-bis(triclorosilyl)coronene, bis(mercaptomethylene)-bis(triclorosilyl)dichlorocoronene, bis(mercaptomethylene)-bis(triclorosilyl)dibromocoronene, bis (mercaptomethylene)-bis(triclorosilyl)-tetrachlorocoronene, bis(mercaptomethylene)-bis(triclorosilyl)tetrabromocoronene, bis(mercaptomethylene)-bis(triclorosilyl)hexachlorocoronene, bis(mercaptomethylene)-bis(triclorosilyl)tetrabromocoronene, bis(mercaptomethylene)-bis(triclorosilyl) hexabromocoronene, tris(mercaptomethylene)-bis (triclorosilyl)coronene, tris(mercaptomethylene)-bis (triclorosilyl)-tetrachlorocoronene, tris(mercaptomethylene)-bis(triclorosilyl)-tetrabromocoronene, tetrakis(mercaptomethylene)-bis(triclorosilyl)coronene, tetrakis(mercaptomethylene)-bis(triclorosilyl)-dichlorocoronene, tetrakis(mercaptomethylene)-trichlorosilyl-dibromocoronene, tetrakis(mercaptomethylene)-trichlorsilyl-tetrachlorocoronene, tetrakis(mercaptomethylene)-trichlorosilyl-tetrabromocoronene, tetrakis(mercaptomethylene)-trichlorosilyl-hexachlorocoronene, tetrakis(mercaptomethylene)-trichlorosilyl-hexabromocoronene, mercaptoethylene-trichlorosilylcoronene, bis(mercaptoethylene)-trichlorosilylcoronene, tris(mercaptoethylene)-trichlorosilylcoronene, tetrakis(mercaptoethylene)-trichlorosilylcoronene, tetrakis (mercaptomethylene)-trichlorosilyl-dichlorohexabenzocoronene, tetrakis(mercaptomethylene)-trichlorsilyl-tetrachlorohexabenzocoronene, tetrakis(mercaptomethylene) dibromohexabenzocoronene, tetrakis(mercaptomethylene) tetrabromohexabenzocoronene, mercapto-silanolcoronene, mercapto-bis(silanol)-dichlorocoronene, mercapto-bis(silanol)-dibromocoronene, mercapto-bis(silanol)-tetrachlorocoronene, mercapto-bis(silanol)-tetrabromocoronene, dimercapto-bis(silanol)coronene, dimercapto-bis(silanol)dichlorocoronene, dimercapto-bis(silanol)-dibromorocoronene, dimercapto-bis(silanol)-tetrachlorocoronene, dimercapto-bis(silanol)tetrabromocoronene, trimercapto-bis (silanol)-coronene, trimercapto-bis(silanol)tetrachlorocoronene, trimercapto-bis(silanol)tetrabromorocoronene, tetramercapto-bis(silanol)coronene, tetramercapto-bis(silanol) dichlorocoronene, tetramercapto-bis(silanol)dibromocoronene, tetramercapto-bis(silanol)tetrachlorocoronene, tetramercapto-bis(silanol)-tetrabromocoronene, pentamercapto-silanolcoronene, mercaptomethylene-bis(silanol) coronene, bis(mercaptomethylene)-bis(silanol)coronene, bis (mercaptomethylene)-bis(silanol)dichlorocoronene, bis (mercaptomethylene)-bis(silanol)dibromocoronene, bis (mercaptomethylene)-bis(silanol)-tetrachlorocoronene, bis (mercaptomethylene)-bis(silanol)tetrabromocoronene, bis (mercaptomethylene)-bis(silanol)hexachlorocoronene, bis (mercaptomethylene)-bis(silanol)tetrabromocoronene, bis (mercaptomethylene)-bis(silanol)hexabromocoronene, tris (mercaptomethylene)-bis(silanol)coronene, tris (mercaptomethylene)-bis(silanol)-tetrachlorocoronene, tris (mercaptomethylene)-bis(silanol)-tetrabromocoronene, tetrakis(mercaptomethylene)-bis(silanolv)coronene, tetrakis (mercaptomethylene)-bis(silanol)-dichlorocoronene, tetrakis(mercaptomethylene)-silanol-dibromocoronene, tetrakis (mercaptomethylene)-silanol-tetrachlorocoronene, tetrakis (mercaptomethylene)-silanol-tetrabromocoronene, tetrakis (mercaptomethylene)-silanol-hexachlorocoronene, tetrakis (mercaptomethylene)-silanol-hexabromocoronene, mercaptoethylene-silanolcoronene, bis(mercaptoethylene)-silanolcoronene, tris(mercaptoethylene)-silanolcoronene, tetrakis(mercaptoethylene)-silanolcoronene, tetrakis(mercaptomethylene)-silanol-dichlorohexabenzocoronene, tetrakis(mercaptomethylene)-silanol-tetrachlorohexabenzocoronene, tetrakis(mercaptomethylene)dibromohexabenzocoronene, tetrakis(mercaptomethylene)tetrabromohexabenzocoronene, bis(p-mercaptomethylenephenyl)-bis(p-trichlorosilyl)-bis(tetrachlorophenyl)benzene, tetrakis(p-mercaptomethylene-m,m'-dichlorophenyl)-bis (trichlorosilylphenyl)benzene, tetrakis(p-mercaptoethylene)-bis(p-trichlorosilyl)benzene, tetrakis(p-mercaptomethylene-m,m'-dibromophenyl)-bis(p-trichlorosilyl)benzene, bis(p-mercaptomethylenephenyl)-tetrakis(tetrachlorophenyl)benzene, mercaptotrichlorosilylpyrene, mercapto-trichlorosilyl-tetrachloropyrene, mercapto-trichlorosilyl-tetrabromopyrene, mercapto-trichlorosilyl-methylenepyrene, mercapto-trichlorosilyl-methylenetetrachloropyrene, mercaptomethylene-trichlorosilyl-tetrabromopyrene, mercaptoethylene-trichlorosilyl-tetrachloropyrene, mercaptoethylene-trichlorosilyl-tetrabromopyrene, mercaptoethylene-trichlorosilylpyrene.

It is noted that the scope of the invention is not restricted to specific positions of the functional groups on the aromatic skeleton of each exemplary molecule.

In some embodiments, compound B (having formula II: $G\text{-}X^1{}_nX^2{}_mY^1{}_mY^2{}_k$) is selected from compounds III or IV:

(III)

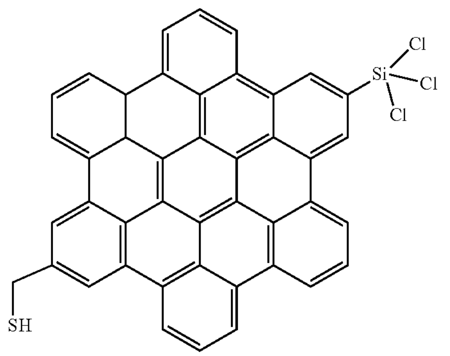

(IV)

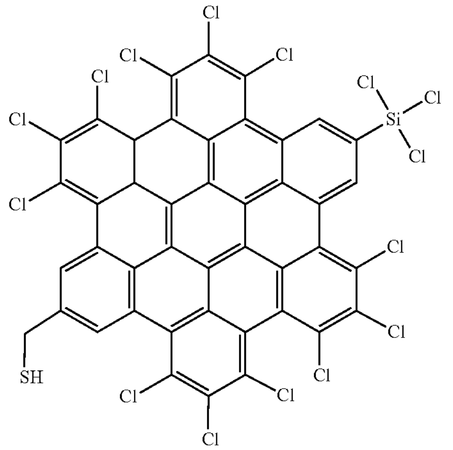

Referring back to FIG. 1, the first graphene molecular precursor is deposited on the metallic surface and at least partially reacted with the metallic surface to form covalent bonds between at least a portion of the $X^1$ tethering groups and the metallic to obtain a metallic layer covalently linked to a graphene molecular precursor layer (step 130).

According to certain embodiments, the deposition of the graphene precursor on the metallic surface is performed by dip coating or by vacuum deposition. According to some embodiments the deposited graphene molecular precursor forms a graphene molecular precursor coating on the metallic surface. According to some embodiments, the deposition excludes deposition by CVD.

The term "dip coating" relates to a coating process that may comprise, immersion of a substrate in a solution, a start-up step in which the substrate has remains inside the solution for a while before being pulled out of the solution, a deposition step in which a thin layer deposits itself on the substrate while it is pulled out of the solution, and an evaporation step in which solvent is evaporated from the thin layer formed the surface of the substrate.

The term "vacuum deposition" relates to a family of processes used to deposit layers of material atom-by-atom or molecule-by-molecule on a solid surface. These processes typically operate at pressures well below atmospheric pressure (i.e., vacuum).

The reaction between the tethering group and the metallic surface may occur spontaneously as the first graphene molecular precursor is coated/deposited on the metallic surface. According to some embodiments the surface of the metallic layer should be kept at elevated temperature to ensure sufficient reaction rate. According to some embodiments the temperature of the surface of the metallic layer should be kept at temperatures higher than 150° C., 200° C. or 250° C. For example, when the tethering group is mercaptomethylene then sulfur-metal bonds spontaneously form between the graphene molecular precursor and the metallic surface.

According to certain embodiments the metallic layer onto which the first graphene molecular precursor is bound comprises an interconnect arrangement embedded in a top layer during the manufacturing of a wafer chip comprising a semi-conductor substrate (e.g., a silicon substrate) having electric circuit elements formed on its upper surface. This interconnect arrangement is sometimes referred to as damascene or damascene wiring.

The graphene precursor may be selected such as to enable vacuum deposition, being volatile at conventional vacuum chambers operating at pressures not higher than $1e^{-3}$ Torr, in some embodiments not higher than $1e^{-4}$ Torr and at temperatures not lower than 150° C., not lower than 200° C. or not lower than 250° C., and not higher than 500° C., or not higher than 400° C. Correspondingly G, the hydrocarbon component of graphene precursor may contain less than 100 carbon atoms, in some embodiments less than 90, 80, 70, or 60 carbon atoms.

According to some embodiments the compounds of the first graphene molecular precursor are deposited consecutively or concomitantly. Referring in more detail to vacuum deposition, precision Atomic Layer Deposition (ALD) may be used, a process in which a series of pulses of reactants (in particular molecular precursors) or catalysts are inserted (e.g., by sublimation or evaporation of the reactant) into the chamber, to react at the surface of a substrate (e.g. a metallic surface, and in particular a wafer damascene or an already existing graphene film surface) in a controlled manner and to precisely control the thickness, fill factor and composition of the formed graphene molecular precursor layer/coating. The insertion of the reactant into the chamber may be controlled and operated by preconfigured valve opening and by preconfigured temperatures in the molecular precursor(s) container(s) and the reaction chamber. According to some embodiments, for the formation of the layer of covalently bound molecular precursors, one or more pulses of first precursor are inserted into the chamber by vaporizing a solution of a molecular precursor or by bubbling, e.g., using $N_2$ or Ar, a solution or a colloidal suspension of the compound(s), or by sublimation of a powder or by otherwise atomizing the compound mixture (e.g., an ultrasonic atomizer or a nozzle). Thus, precise control of the thickness of the deposited layer/coating of the precursor may be achieved enabling consistent control of the following stages of the process. According to some embodiments, during the series of pulses one or more pulses of second precursor are interleaved with the pulses of the first precursor. According to some embodiments the second molecular precursor comprises compounds having different hydrocarbon component G or different tethering groups from the first graphene molecular precursor, e.g., $X^1{}_i$ metal tethering groups or $X^2$, different additional tethering groups, e.g., to control the fill factor on the substrate surface. According to some embodiments the first and second molecular precursors comprise compounds having different functional groups $Y^1{}_m$ and $Y^2{}_n$, e.g., to control the uniformity and defect ratio of the formed graphene films. According to embodiments more than two graphene molecular precursors or mixtures thereof may be used (while each molecular precursor can be a mixture of compounds). According to some embodiments one or more of the graphene molecular precursors may comprise compounds comprising additional tethering groups, e.g., $X^{2G}$. According to some embodiments, a catalyst (e.g., a catalyst for catalyzing formation of C—C bonds between two different molecules of a compound comprised in the graphene molecular precursor) may be incorporated into the process; during the series of pulses one or more pulses of the vaporized catalyst are inserted into the chamber and at least partially deposited on the surface of the substrate. According to such embodiments the catalyst may be a metal catalyst selected from Pd, Pt, Cu, Au, Ni, W and Co, an organometallic catalyst thereof or a mixture thereof.

According to some embodiments, the first graphene molecular precursor further comprising at least two different compounds of formula I or formula II. According to some embodiments the first graphene molecular precursor further comprising up to 20 different compounds of formula I or formula II.

According to some embodiments, step 120 of the method obtaining the first graphene molecular precursor further comprising obtaining at least one of compound C having formula III $$G-Y^1_mY^2_n;\ \text{and} \qquad \text{formula III}$$

compound D having the molecular formula IV $$GX^2_jY^1_mY^2_n \qquad \text{formula IV}$$

wherein G, $X^2$, $Y^1$ and $Y^2$ are defined as above.

According to some embodiments compound B (having formula II: $G-X^1{}_iX^2{}_mY^1{}_mY^2{}_k$) bears tethering groups to a non-metal surface when $X^2$ is $X^{2N}$ and is selected from: tetrakis(trichlorosilyl)rubrene, tetrakis(trichlorosilyl)difluororubrene, tetrakis(trichlorosilyl)coronene, tetrakis(trichlorosilyl)difluorohexabenzocoronene, p-tetrakis(trichlorosilyl)difluorohexaphenylbenzene, hexachloropyrene and mixtures thereof. It is noted that the scope of the invention is not restricted to specific positions of the functional groups on the aromatic skeleton of each exemplary molecule. In some embodiments, the graphene molecular precursor $G-X^1{}_iY^1{}_mY^2{}_k$ is selected from compounds IX, X and mixtures thereof:

(IX)

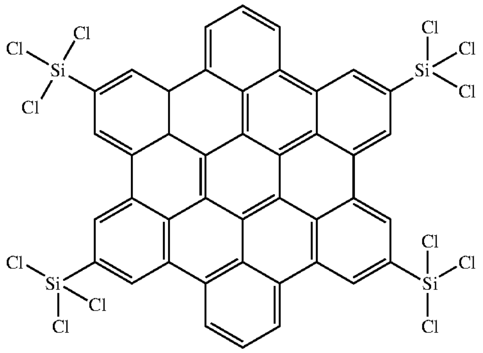

(X)

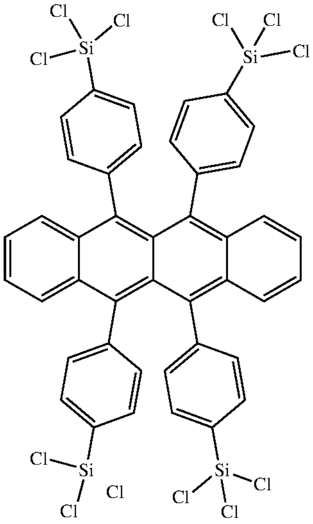

According to some embodiments, the first graphene molecular precursor may comprise several compounds wherein each in turn may comprise several of: (i) compounds having tethering groups for covalently bonding to the surface of the metal layer to form a coating, (ii) compounds having tethering groups for covalently bonding to the surface of the metal layer to form a coating, and additional tethering groups that may be utilized in following process steps and (iii) compounds having no tethering groups. The combination of different compounds provides important advantages which will be elaborated further below. According to embodiments where the graphene molecular precursor is a mixture of compounds, several compound mixtures may form the graphene molecular precursor and may be mixed in advance (concomitantly) or used consecutively in interspersed manner.

According to some embodiments the first graphene molecular precursor is a mixture comprising compound C and at least one of compound A and compound B, and the mole ratio between the combined amount of molecular precursors of compound A and compound B and the amount of molecular precursor of compound C being higher than 1:5000, between 50:1 and 1:5000, between 10:1 and 1:1000 or between 1:5 and 1:100.

According to some embodiments, the method of the invention incorporates several separate steps in which a graphene molecular precursor is used to form a plurality of graphene layers, whereas the first graphene molecular precursor or a second graphene molecular precursor may be used to form respective layers. Although, first and second graphene molecular precursor may be different, some of the steps pertaining to their composition preparation or use may be similar, and for clarity, as will be understood from the context, will be disclosed together.

According to some embodiments step 130 according to the method comprises depositing said first graphene molecular precursor on top of the metal surface to obtain a surface at least partially coated with the at least one graphene molecular precursor and bound to the at least one graphene molecular precursor.

According to some embodiments depositing of the graphene molecular precursors (step 130) is performed consecutively or concomitantly i.e., as a mixture. According to some embodiments the composition of the graphene molecular precursor coating on the surface is formed by consecutive pulsated deposition. According to the embodiments at least two different graphene molecular precursors (which each may be a mixture) are deposited in a sequential manner. According to these embodiments a procedure for depositing the at least two different graphene molecular precursors is provided, the procedure may provide a list (periodic or non-periodic) of separate deposition steps wherein in each step as one of the different graphene molecular precursors is deposited. According to embodiments the deposition is by vacuum deposition and, in particular, by ALD. According to embodiments, each of the ALD deposition steps is characterized by set temperatures of the chamber and of the respective evaporated graphene molecular precursor, by a respective valve opening period, enabling the vaporization of the respective graphene molecular precursor into a low-pressure chamber and by a wait period before opening the next respective valve. According to such embodiments a heterogeneous molecular layer coating of graphene molecular precursors of substantially statistically uniform distribution is formed on the surface of the coated layer. According to some embodiments, the distribution statistics of the different graphene molecular precursors on the surface is affected by the molecular affinities between the different graphene molecular precursors and their respective kinetics.

Following the forming of the graphene molecular precursor layer/coating on top of the metal surface is followed by transforming (polymerization) the deposited first graphene molecular precursor layer into a surface bound graphene interfacial layer, (step 140), to obtain a graphene coated metal surface comprising a graphene interfacial layer bound to the surface of the metal. In should be noted that the term interfacial graphene layer refers to a graphene coating that is substantially one layer thick and emphasizes that as such the graphene layer facing different media on each of its face. Accordingly, this graphene layer has special properties which may be different from the properties of graphene layers that have the same media on both sides and in particular graphene layers that have other graphene layers on both sides. However, as this interfacial layer is a coating, we will use the terms 'graphene Interfacial layer', 'graphene Interfacial layer or coating' and 'graphene Interfacial coating' interchangeably as will be clear from the context. According to some embodiments, the transforming of the graphene molecular precursors coating the metallic surface is achieved by maintaining the surface at elevated temperature, preferably at temperatures higher than 150° C., at temperatures higher than 200° C., or at temperatures higher than 250° C. According to some embodiments, a first radiation source is used to radiate the graphene molecular precursor layer at wavelengths (light frequencies) and intensity sufficient for conversion of the graphene molecular precursor layer into a graphene film to obtain a metallic surface coated by a graphene interfacial layer or coating wherein the metallic surface being covalently connected to the graphene interfacial layer or coating (step 140). According to certain embodiments radiation of 20,000 $mJ/cm^2$ at 375 nm is sufficient. According to some embodiments, radiation as low as 500 $mJ/cm^2$ at 375 nm is sufficient. According to certain embodiments, radiation of between 500 $mJ/cm^2$ to 20,000 $mJ/cm^2$ at 375 nm is employed. According to certain embodiments radiation of about 500, 600, 700, 1000, 2000, 3000, 4000, 5000, 6000, 7000, 8000, 9000, 10000, 15000 or 20,000 $mJ/cm^2$ at wavelengths in the range 325 to 450 nm is employed. According to certain embodiments the first light source may be a LED or a laser. According to such embodiments, the wavelengths of the first light source may be selected to be preferably absorbed in the graphene precursor layer. Selection of the wavelengths of the first radiation source may be based on an absorption ratio between the absorption coefficient of the graphene molecular precursor relative to the absorption coefficient of the metal or, in case that the metal material in an interconnect laid up on and embedded in a semi-conductor wafer, the weighted (average) absorption coefficient of the composite material comprised by the metal interconnect net and the semi-conductor layer that is part a wafer in which the interconnect net is embedded in. According to certain embodiments, the absorption ratio is larger than 10 and preferably larger than 100. According to certain embodiments the first radiation source is a UV radiation source comprising wavelengths predominantly shorter than 450 nm. Selecting such UV radiation source has important advantages, including potential localization of the radiation due to the short wavelengths (e.g., supplemented by use of high numerical aperture, low aberration optics) and efficient use of the energy through a photo-excitation process which directly leads to the formation of reactive moieties that react to form the graphene interfacial layer or coating. The above transforming conditions pertain also to additional transforming steps of additional graphene precursor coatings bonded to graphene layers of further process steps that are disclosed further below.

According to some embodiments of the invention the process of the formation of the covalently bound graphene interfacial layer or coating from covalently bound graphene precursor is performed at relatively low temperatures, below 500° C. or below 400° C. and in some embodiments, below 350° C. below 300° C., below 250° C. or below 200° C. Process temperature may be controlled by controlling the temperature in a process chamber or by locally controlling the temperature in the region that is exposed to the radiation from the first radiation source and in particular by controlling the temperature in the graphene precursor layer region that is exposed to the radiation from the first radiation source. This can be performed for example by a second radiation source selected to locally irradiate in coordinated fashion said region of the graphene precursor layer radiated by the first irradiation source. The wavelengths of such second radiation source may be selected to have the absorption ratio (between absorption coefficient of the graphene precursor and the absorption coefficient of the non-metallic layer or the absorption coefficient of a semi-conductor layer that is part a wafer in which the metal is embedded) is higher than 10, in some embodiments higher than 100 and in some embodiments, higher than 1000. For example, in case of a graphene precursor layer formed on top a copper interconnect net embedded in a silicon wafer, the second radiation source may be selected to provide light at wavelengths longer that 1.3 micron and in some embodiments shorter than 1.6 micron. Due to their availability laser and LED with wavelength 1.5+/−0.1 micron may be a convenient selection. An advantage of the use of a combination of localized heating and localized photo-excitation is the ability to precisely localize the formation of the graphene film.

Additionally, or alternatively, the temperature in the reaction chamber, during the polymerization process is monitored by common methods available in the art, for example, by positioning, on the metallic surface, labels containing photo thermal switching dyes, indicative of the maximal temperature on the surface. An example of such labels are non-reversible temperature labels marketed by Omega Engineering Inc. of Norwalk, CT, USA. An infra-red camera or a thermocouple may also be used to monitor the temperature as known in the art.

Alternatively, in certain embodiments, the formation of a covalently bound graphene interfacial layer or coating from the covalently bound graphene precursor coating may be performed by irradiation with a first radiation source with sufficient intensity in the IR region and in particular at wavelengths between 1.3 micron and 1.5 micron wherein the first radiation source has an absorption ratio higher than 10, in some embodiments higher than 100 and, in some embodiments, higher than 1000.

According to certain embodiments, the formation of covalently bound interfacial graphene layer or coating may be monitored by Raman spectrography. According to such embodiments, a third radiation source is used to generate Raman scattering, typically in the visible or IR wavelength range. Raman scattering is used to characterize the presence of graphene and may provide signals indicative of the regions comprising the un-polymerized graphene precursor layer. Accordingly, in some embodiments, Raman scattering signal indicative of a presence of a full layer of graphene within a detected region (or indicative of elimination of the graphene precursor) is used to indicate the state of the polymerization of graphene precursor layer and when appropriate, to arrest the radiation of light of the first or second source which, in some embodiments, drive the generation of the graphene interfacial layer or coating. According to some embodiments, Raman spectra may also be used to monitor the quality of the formed graphene film using for example the intensity ratio of the respective spectral lines/peaks indicative of the formation of the graphene layer and the exhaustion of the precursor. As for example disclosed in Araujo P. T. et al. *Materials Today* 2012, 15, 98-109, defect density (number of defects per $cm^2$) may be estimated directly from this ratio. Alternatively, coverage ratio or coverage continuity of the graphene film may be used to quantify its quality, measuring the percent of the area of the graphene film that is without defect. However, this measure should be used carefully in the right context as for example, in large, say 100 $cm^2$, transparent electrode 99% coverage can be a 1 $cm^2$ defect or a hundred 1 $mm^2$ defects—two extreme cases which might have very different implications on the quality of the product. According to certain embodiments, the second and third radiation sources may be one and the same source. According to certain embodiments, Raman scattering which is dependent on the temperature of the scattering material is used to probe the temperature of the irradiated graphene precursor layer or the formed graphene interfacial layer or coating, to monitor and control their respective temperatures, thereby enabling better control of process temperature and higher, more repeatable quality of the formed graphene interfacial layer coating.

According to further aspects of the invention additional monitoring (step 150, FIG. 1) of the process may be performed to increase its reliability and consistency, to perform quality assurance and to detect an authenticity signature of a produced film being part of a device. According to certain embodiments, the formation of covalently bound graphene film may be monitored by fluorescence microscopy or spectrography. According to some embodiments, monitoring graphene film formation during manufacture process of graphene interfacial layer or coating of a surface comprises (i) obtaining fluorescent microscope photos (signals) at intervals during the process, (ii) identifying fluorescence of a graphene molecular precursor as evidence for deposition of graphene molecular precursor, (iii) identifying reduction of fluorescence intensity of graphene molecular precursor as evidence for transformation of the graphene molecular precursor into graphene film fluorescence incomplete process and (iv) identifying reaching minimal fluorescence intensity as an end point of the manufacturing process of graphene interfacial layer or coating of the metallic surface. According to further embodiments fluorescent microscope photos (signals) before and after each step of the process of manufacture may be obtained and used, e.g., as reference. According to some embodiments integrated collection of a fluorescent signal through appropriate optics may be performed instead of or in parallel to taking microscope photos.

According to some embodiments measuring surface contact angle of the substrate and identifying typical surface contact angle measurement may be used as evidence for formation of a desired surface after each step of the manufacturing process.

In embodiments in which a metal catalyst is used, traces of the catalyst remain in the formed graphene film coated non-metallic layer, either as dispersed traces (e.g., atomic layers or nano-clusters) between the graphene layer and the metallic surface or on top of the graphene coating. Thus, the spectroscopic signature of the catalyst traces which may be detected (e.g., in expected locations) and may serve as authenticity signature of a produced graphene film on a metallic surface, being part of a device.

According to some embodiments, mixtures having different proportions between the compounds and/or a different combination of compounds may be used to form the graphene molecular precursor coating of step 120. For example, a combination of compounds used to form the graphene molecular precursor may comprise (i) partially halogenated rubrene, e.g. dichlororubrene, (ii) bis(mercaptomethylene) rubrene and (iii) trimercaptotrichlorosilylrubrene in molar ratios of 4 and 10 for the dichlororubrene to bis(mercaptomethylene)rubrene and dichlororubrene to trimercaptotrichlorosilylrubrene respectively. In another example a combination of compounds used to form the graphene molecular precursor may comprise (i) tetrabromocoronene, (ii) mercapto-bis(triclorosilyl)-tetrabromocoronene, and (iii) dimercapto-bis(triclorosilyl)coronene in molar ratios of 7 and 5 for the tetrabromocoronene to mercapto-bis(triclorosilyl)-tetrabromocoronene and tetrabromocoronene to dimercapto-bis(triclorosilyl)coronene respectively. According to such embodiments, the ratio of defects in the formed graphene interfacial layer or coating may be controlled by controlling the ratios of different graphene molecular precursors. In some embodiments, the used graphene molecular precursor comprising compound C reduces the tethering groups ratio and reduces the ratio of potential defects in the manufactured graphene interfacial layer or coating because it reduces the ratio of tethering groups which inherently induce defects in the graphene layer. Further, the use of use graphene molecular precursor comprising compound C may reduce steric effects and allow for better packing of the graphene molecular precursors on the surface further reducing the ratio of potential defect in the graphene layer. According to some examples the ratio of defects in the graphene layer is less than 1E 12 defects per $cm^2$, according to some embodiments less than 1E11 defects per $cm^2$ or less than 1E10 defects per $cm^2$. The use of graphene molecular precursor comprising compound B or D enables for example tethering a second coating or second layer on top the graphene coating and controlling the ratios between the various graphene molecular precursors of compound A to compound D enables controlling the strength the bonding between the different coatings or layers.

In some embodiments, after the graphene coating is obtained small aromatic molecules such as benzene, biphenyl, phenanthrene, anthracene, naphthalene, optionally derivatized by $Y^1$ and $Y^2$ groups defined above, or mixtures thereof can be deposited on top of the graphene interfacial layer or coating followed by further transforming, e.g., activation by elevated temperatures or irradiation, whereas the additional depositing and transforming is configured to fill defects in the graphene film which may have formed. According to some embodiments the deposition of small aromatic molecules, optionally derivatized by $Y^1$ and $Y^2$ groups defined above, or mixtures thereof can be performed as part of a procedure of the deposition and transforming steps, e.g., pulsed deposition in an ALD deposition process.

According to some embodiments the first graphene molecular precursors comprise a compound having tethering groups $X^{2M}$ to a second material being a second metal material having a surface wherein the second metal material being same as, or different from the first metal material.

After completing a first graphene interfacial layer or coating, a new layer of graphene molecular precursors, being same or different from the graphene molecular precursors of the preceding layer may be deposited on top of the formed graphene interfacial layer or coating wherein the graphene coating is substantially similar in its properties (e.g., mechanical properties) and optionally different in the tethering groups or defect and edge properties. According to some embodiments some properties of adjacent graphene layers may be different due to different interactions with adjacent coupled layers (graphene layers or metal or non-metal surfaces), or due to different defect ratios and characteristics.

According to some embodiments a procedure used to form a coating of a second graphene molecular precursor may comprise depositing and transforming a mixture of compounds forming the second graphene molecular precursor as described above with the required changes to account for difference of the surface or layer onto which the compounds of the molecular precursor are coated onto and optionally accounting for an additional layer which will be subsequently formed thereon. According to embodiments the deposition of the new coating layer of graphene molecular precursors can be done by dip coating or by vacuum deposition (e.g., Atomic Layer Deposition ALD), as described above, with the required changes to account for different process conditions.

Reference is made to FIG. 2 illustrating of forming of at least two graphene layers over a metal surface, the method comprising obtaining a graphene coated metal surface comprising a graphene interfacial layer bound to the surface of the metal as disclosed in reference to FIG. 1 (step 204).

According to some embodiments the method comprises obtaining a second graphene precursor comprising at least one compound selected from the group consisting of compound A, compound B, compound C, compound D, compound E having molecular formula V $$G-X_i^3Y_m^1Y_n^2,\ \text{and} \qquad \text{formula V}$$

compound F having molecular formula VI $$G-X_i^2X_j^3Y_m^1Y_n^2 \qquad \text{formula VI}$$

wherein, G is a $C_6$-$C_{100}$ hydrocarbon component, $X^{21}$ defined as above, $X^3$ is a tethering group to the surface of the graphene coating selected from the group defined for $X^{2G}$ and being different than the tethering group $X^{2G}$ selected for compound B or D; $Y^1$, $Y^2$ are independently selected from the group consisting of hydrogen, halogen radical and —COOH and i, j, m and n are independent integer numbers having a value selected between 1 and 20 (step 208).

According to some embodiments at least one compound of the second graphene molecular precursor is functionalized by group $X^2$ is $X^{2G}$ being a graphene tethering group (whereas it should be noted that “having tethering groups” or “functionalized by tethering groups” are interchangeable). According to these embodiments the method further comprising depositing the second graphene molecular precursor on top of the graphene coated metal surface to obtain a graphene coated material wherein the first graphene coating being at least partially coated with the second graphene molecular precursor (step 212) and transforming the deposited second graphene precursor into a top graphene coating to obtain a graphene coating comprising at least a graphene interfacial layer and a top graphene coating (step 216), the graphene interfacial layer being bound to the surface of the metal. According to some embodiments at least one compound of the first graphene molecular precursor is functionalized by group $X^{2G}$ or at least one compound of the second graphene molecular precursor is functionalized by group $X^{2G}$ or both, wherein the graphene interfacial layer being bound to the top graphene coating.

According to some embodiments, tethering groups in different layers may interact with each other. Thus for example, (i) a first graphene molecular precursor comprises a compound comprising $X^{2G}$ being a basic group, e.g., —$NR^3R^4$, may be deposited in a first coating and a second graphene molecular precursor comprises a compound comprising $X^{2G}$ being an acidic group —$R^1COOH$ may be deposited in a second coating, or (ii) a first graphene molecular precursor comprises a compound comprising $X^{2G}$ being an acidic group —$R^1COOH$ may be deposited in a first coating, and the second graphene molecular precursor in a second coating comprises a compound comprising $X^{2G}$ being a basic group $X^2$ is —$NR^3R^4$. According to some embodiments, the acidic group is selected from —$R^1COOH$ and the basic group is selected from $NR^3R^4$.

The deposition and transforming process can be iterated as much as needed in order to obtain a desired number of graphene layers or coatings. The graphene molecular precursors can be the same or different in each iteration. According to some embodiments the method further comprises the steps of obtaining a second graphene molecular precursor, depositing of said second graphene molecular precursor on top of the first graphene coated metal material and transforming the deposited graphene molecular precursor to a top graphene coating are repeated, as indicated by arrow 220 in FIG. 2, to obtain a graphene coating comprising at least three graphene coatings, the graphene interfacial layer being bound to the first surface (the metal). For example, the number of coatings may be at least 4 coatings or at least 6 coatings. According to some embodiments the number of graphene layers formed in the thus repeated process is 2 to 12 graphene coating layers, according to some embodiments the number is 2 to 6.

According to some embodiments at least one of the compounds of the second graphene molecular precursor comprises a compound having a tethering group $X^{2N}$, forming a top layer of coating that is formed to form bonds with a non-metal material, and the method further comprising depositing a non-metal material on top of the top graphene coating, to obtain a layered structure comprising a graphene coating bound to the metal surface and bound to a non-metal material layer on top of the graphene coating. According to some embodiments targeted at the forming of interconnects, this arrangement of layers enables the use of thin interconnects of metals such as copper, aluminum or ruthenium within a complex BEOL section of a VLSI semiconductor device while mitigating issues such as metal diffusion into the non-metallic (dielectric) layers. According to some embodiments the metal material is a first metal material, at least one of the compounds of the second graphene molecular precursor comprises a compound having a tethering group $X^{2M}$ and further comprising the step of depositing a second metal having a surface being same as, or different from the first metal surface on top of the top graphene coating, to obtain a layered structure comprising a graphene coating bound to the metal surface and bound to the second metal material layer on top of the graphene coating.

According to some embodiments the method comprises repeated metal material deposition layers interleaved with graphene coatings; each graphene coating covalently bonded to its adjacent metal layers. According to some embodiments, the interleaved graphene coating (molecular precursor deposition and transforming into a coating) and metal deposition are performed by ALD optionally by the insertion (e.g., by evaporation or sublimation of organometallic complexes and their decomposition after being adsorbed or reacted with the graphene coating. According to some embodiments tethering groups protruding from the graphene layer react with such organometallic complexes to form bond the metal to the graphene coating. According to some embodiments the graphene coating may be treated to form reactive sites that may react with such organometallic complexes. Thus, for example, the graphene layer may be treated with ozone to form carbonyl groups at the surface and a layer of an organometal complex such as tungsten-hexacarbonyl $W(CO)_6$ may be deposited by ALD on the treated graphene layer. Further treating the deposited organo-metallic layer and treated graphene layer leads to decomposition of the organometallic complex, leaving a tungsten layer on top of the graphene layer. Another example is deposition by sublimation of copper (II) acetylacetonate complex, $Cu(C_5H_7O_2)_2$, which may be performed at temperature less than 210° C. and pressure less than 300 Torr, and which may be decomposed to form a copper layer in low temperatures, 220° C. to 250° C., (in $H_2$— Ar carrier gas).

As an additional example, tethering groups in a second graphene layer may be used to directly bond the metal layer of the second graphene layer. For example, the graphene layer onto which the metal is being deposited may comprise functional group capable of tethering to a metal such as mercaptoethylene that spontaneously form sulfur-metal bonds between the graphene molecular precursor forming the preceding layer and the metallic surface/substrate. Then, a new layer of graphene molecular precursors coated on top of the first graphene interfacial layer may comprise other tethering groups, for example compounds having pyrene-carboxylic acid groups as tethering groups. These groups form bonds with a metal layer in different conditions and thus, these groups may be controlled to react in a later stage and may be used to form bonds between the new graphene layer and an additional metal layer that will later be coated on top of the formed graphene coating. Alternatively, the second tethering group that is intended for forming carbon metal bond with the additional metal layer, may be protected by a protection group (i.e., an ester) and activated only after the formation of the first graphene layer on top of the first metal layer.

According to some embodiments the deposited metal between graphene layers forms clusters between the graphene coating layers or thin metal layers, forming an interleaved metal graphene layer structure. According to some embodiments the metal layers are less than 10 nm thick, or less than 2 nm think, or less than 1 nm thick. In some embodiments the graphene layer is used as a conductive layer in a desired application. According to some embodiments the interleaved metal graphene layer structure has high conductivity. According to some embodiments the conductivity of the interleaved metal graphene layer structure is higher by a factor of 3, 5, 10 or even 30, relative to any one of the metals or of any metal composition used (manufactured in similar dimensions) in the interleaved metal graphene layer structure.

According to some embodiments the first or second graphene molecular precursor is obtained according to a predetermined procedure comprises compound C, in a mole ratio in the range 0.1 to 0.9999 (1−1E-4) of the total amounts of molecular precursors of compounds A to F, in some embodiments the mole ratio is in the range 0.5 to 0.999 and in some embodiments the mole ratio is in the range of 0.7 to 0.99.

According to some embodiments a predetermined procedure comprises the use of at least two separate graphene molecular precursor mixtures wherein, at least one mixture comprising compound C and at least one other mixture comprising at least one of compounds A to F, and wherein depositing comprises consecutive depositing of the separate mixtures to obtain an interspersed coating with at least two graphene molecular precursors. According to some embodiments depositing the separate mixtures comprises depositing the separate mixtures according to a configured and operable schedule. In an example application the depositing may be performed by ALD.

Afterwards, i.e., after the deposition step, according to some embodiments, the graphene molecular precursors are irradiated to form a second graphene film as described above. According to some embodiments of the method the metallic surface remains intact during the radiation on the graphene precursor and formation of graphene coating. According to some embodiments, during depositing the conditions for transforming are maintained (e.g., maintaining elevated temperature within the reaction chamber or maintaining irradiation conditions) and transforming the precursor coating coated onto the surface is performed in parallel to the depositing of the graphene molecular precursor.

According to some embodiments the graphene film coated metallic surface is for use in a wide range of applications such as, without wishing to be limited thereto, an interconnection in a device selected from the group consisting of back end of lines (BEOL), nano-electro-mechanical device, photovoltaic cells, Organic LED and transparent conductive electrodes, electro-optical sensors, and graphene transistors, or high conduction interconnects.

Figure 3A:
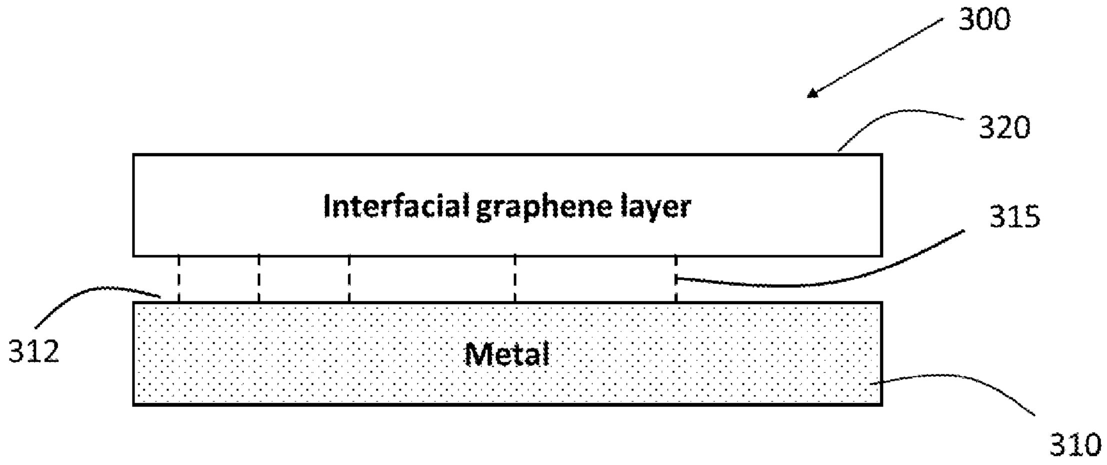
FIG. 3A to FIG. 3E schematically depict different products formed according to the method disclosed in reference to FIG. 1 to FIG. 2 according to embodiments of the invention.
Figure 3B:
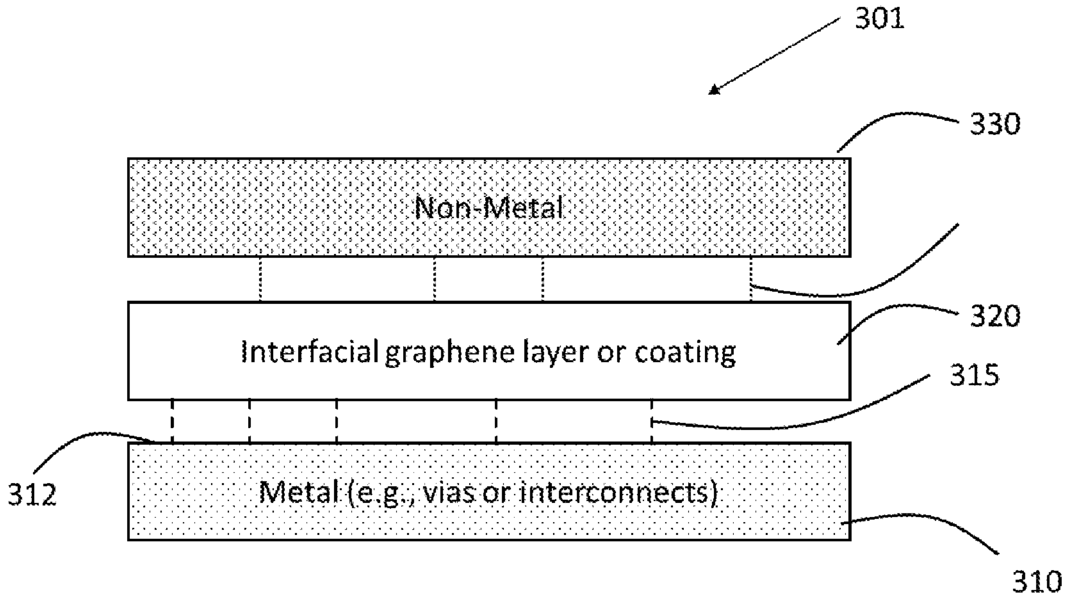

Reference is made to FIG. 3A and FIG. 3B, schematically illustrating a product of the invention as illustrated with respect to FIG. 1. FIG. 3A schematically illustrates a product (300) comprising a metallic layer (310) having a metal surface (312), and a graphene interfacial layer or coating (320) where the metallic surface 312 in this example is covalently linked to the interfacial graphene layer coating 320 forming a graphene coated metal material comprising a covalent bond (315) between the graphene coating and the metal surface. According to embodiments the graphene coating is further characterized by at least one of:

(i) a graphene defect density lower than $10^{10}$ defects per $cm^2$, in some embodiments lower than $10^{11}$ defects per $cm^2$ and in some embodiments lower than $10^{12}$ defects per $cm^2$.

(ii) essentially free of catalytic metal residue (iii) graphene coverage of the coated metal surface, higher than 90%

According to some embodiments, the product of the invention further comprises the graphene coated metal material comprising at least two layers of graphene. According to some embodiments the product of the invention further comprises the graphene coated metal material comprising at least a graphene interfacial layer bound to the surface of the metal material and a top graphene coating positioned above the graphene interfacial layer. According to some embodiments the product of the invention further comprises forming the graphene coated metal material comprising between 2-6 layers of graphene, in some embodiments 5 to 12 layers of graphene. According to some embodiments the product of the invention further comprises the graphene coated metal material comprising a bond between two adjacent graphene coatings. According to some embodiments, the bond between the graphene coating and the surface of the metal material is selected from a covalent bond ionic bond and a pi interaction as known in the art (e.g., between an electronegative functional group such as an alkyl halide and an aryl derivatized by an electron withdrawing group). The term "covalent bond" encompasses a coordinate bond. The top graphene layer of the graphene coating may be covalently bound to a surface of a material deposited on top of said top graphene layer.

Figure 3C:
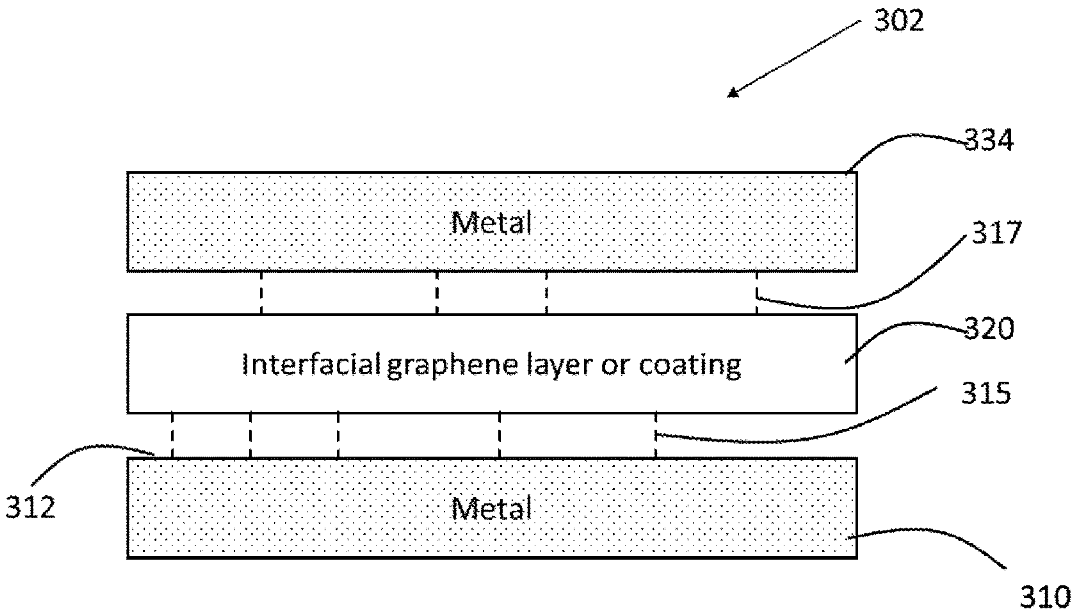

FIG. 3B schematically illustrates a product (301) comprising a metallic layer (310) having a metal surface (312), and a graphene coating (320) where the metallic surface 312 in this example is covalently linked to the graphene interfacial layer coating 320. On top of the graphene interfacial layer 320 a non-metal is deposited (330) said non-metal material covalently linked 325 to the graphene interfacial layer 320. FIG. 3C schematically illustrates a product (302) comprising a first metallic layer (310) having a metal surface (312), and a graphene coating (320) where the metallic surface 312 in this example is covalently (315) linked to the graphene coating 320. On top of the graphene layer 320 a second metal is deposited (334) wherein the second metallic layer may be similar or different from the first metallic layer, said second metal material covalently linked 317 to the graphene interfacial layer 320. According to embodiments, the graphene coated material comprising at least two layers of graphene.

Figure 3D:
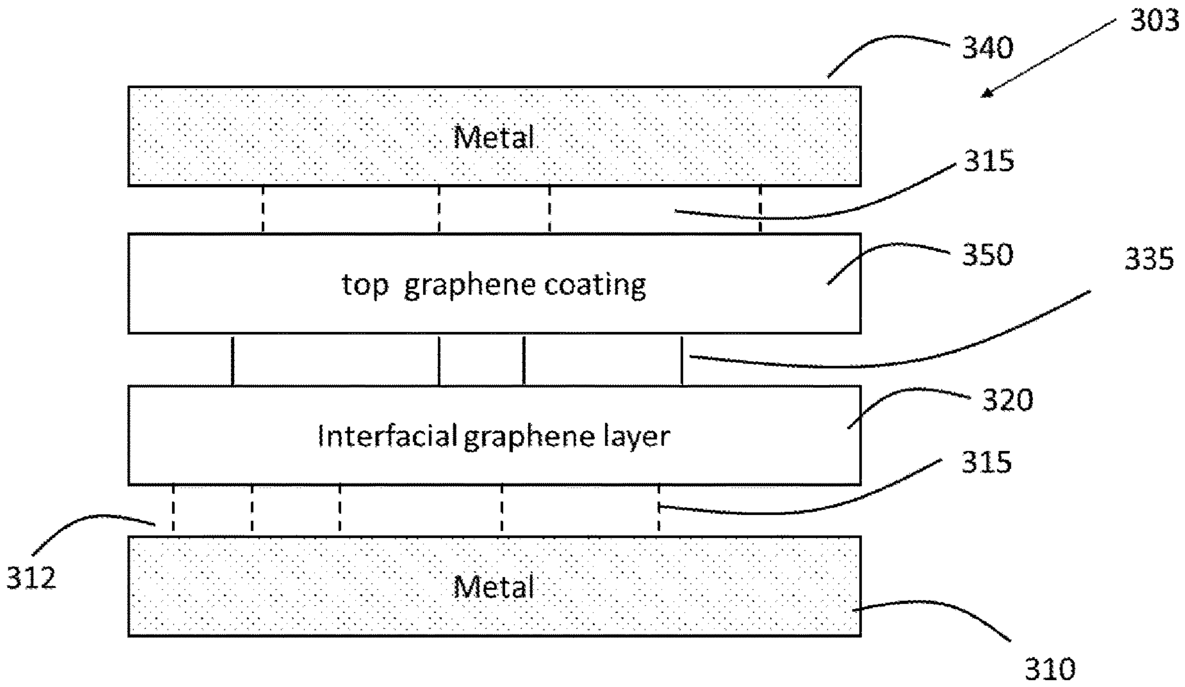

FIG. 3D schematically illustrates a product (303) comprising a metallic layer (310) having a metal surface (312), and a graphene coating (320) where the metallic surface 312 in this example is covalently linked (315) to the graphene interfacial layer coating 320 by metal tethering groups. On top of the graphene interfacial layer 320 a second, top graphene layer (350) is coated where the second graphene layer is bound to the interfacial graphene layer by graphene tethering groups 335. The top graphene layer may comprise several layers of graphene produced in repeating deposition and transforming steps. According to some embodiments, as is further illustrated by FIG. 3D a metal layer 340 may be deposited on top of the second graphene layer.

Figure 3E:
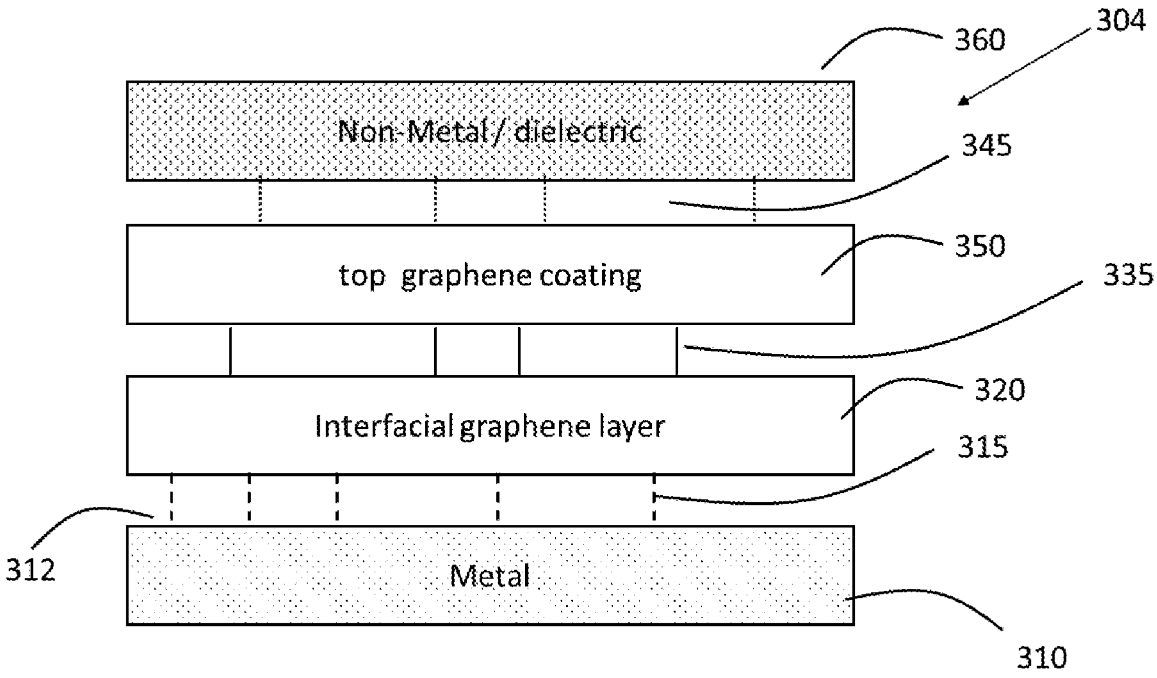

FIG. 3E schematically illustrates a product (304) comprising a metallic layer (310) having a metal surface 312, and a graphene coating (320) where the metallic surface 310 in this example is covalently linked (315) to the graphene interfacial layer coating 320 by metal tethering groups. On top of the graphene interfacial layer 320 a second, top graphene layer (350) is coated where the second graphene layer is bound to the interfacial graphene layer by graphene tethering groups 335. The top graphene layer may comprise several layers of graphene produced in repeating deposition and transforming steps. According to some embodiments, as is further illustrated by FIG. 3E a non-metal layer 360 may further be deposited on top of the second graphene layer being bound to the top graphene layer by non-metal tethering groups forming covalent bonds 345 between respective layers.

According to embodiments a product of the method is a device that comprises a graphene coated metal material comprising a graphene coating and a non-metal material bonded to the graphene coating, said graphene coating covalently bonded to said metal surface and to said non-metal material. According to some embodiments the graphene coating comprises at least two graphene coatings. According to embodiments the graphene coated metal material comprises at least a bottom graphene coating bound to the surface of the metal material and a top graphene coating positioned above the bottom graphene coating.

According to embodiments a product of the method is a device that comprises a graphene coated metal material, further comprising repeated metal material deposition layers interleaved with graphene coatings, each graphene coating covalently bonded to its adjacent metal layers.

As noted with respect to embodiments of the invention described in reference to FIG. 1 and with respect to the polymerization of the first graphene precursor, a radiation source or sources may be selected for initiating, driving and controlling the polymerization. According to some embodiments the wavelength(s) of the radiation source or sources are selected from UV light below 450 nm and IR light above 1.3 micron. Accordingly, the respective materials and radiation sources' wavelengths are selected such that the absorption ratio between the second graphene precursor of formula II and the metal substrate is, or are, in the case of a radiation source predominantly in the UV range, larger than 10, or, in some embodiments, larger than 100, and in the case of a radiation source in the IR range, larger than 100, or, in some embodiments, larger than 1000.

According to some respective embodiments, and in further reference to FIG. 1 or FIG. 2, monitoring and control (step 150) comprises detecting the Raman scattering while radiating with IR light, characterizing presence of graphene and arresting the radiation of light when the Raman scattering is indicative of a presence of a full layer of graphene at the irradiated location.

According to yet a further aspect, the invention provides compounds having a formula any of the molecular formulae of formula I to formula VI and molecules as described above being useful as a precursor to form a graphene coating.

In some embodiments the graphene coated metallic surface is characterized by at least one of: (i) a graphene defect density equal to or lower than $10^{12}$ defects per $cm^2$, in some embodiments lower than $10^{11}$ defects per $cm^2$, in some embodiments lower than 1 ppm and (ii) essentially free of catalytic metal residue, in some embodiments comprising up to atomic layers of metal catalyst, in some embodiments comprising up to nano-clusters of metal (Pd, Pt, Au Ni, W, Co, Cu) (iii) graphene coverage higher than 90%, 95%, 98%, 99% or 99.5%.

The term "essentially free of catalytic metal residue" means herein that the product comprises less than 3% w/w of metal, in some embodiments less than 1%, in some embodiments less than 100 ppm, in any form of pure metal (layers, film, clusters etc.).

According to some embodiments the invention provides a graphene coated interconnect net comprising at least two layers of graphene. According to some embodiments the graphene coated interconnect net comprises between 2-6 layers of graphene.

According to some embodiments the invention provides a graphene coated interconnect which is characterized by an effective conducting wire fill factor of at least 90%.

The graphene coating may have a Young Modulus of at least 20 GPa. In some embodiments the graphene coating may have a Young Modulus of at least 20 GPa, 30 GPa, 40 GPa, 50 GPa, 60 GPa or 70 GPa.

According to some embodiments, the invention provides a graphene coated interconnection wherein the graphene coated metal is a conducting wire e.g., a copper interconnect or an aluminum or ruthenium interconnect characterized by at least one of (i) a graphene defect density equal to or lower than $10^{12}$ defects per $cm^2$, in some embodiments lower than $10^{11}$ defects per $cm^2$, in some embodiments lower than 1 ppm (i.e. one defect per 1 million carbon atoms) (ii) comprising at least two layers of graphene and (iii) an effective Copper fill factor of at least 70%.

According to a further aspect the invention provides a semiconductor device comprising the graphene coated metallic surface.

The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. Embodiments were chosen and described in order to best explain the principles of the invention and the practical application, and to enable others of ordinary skill in the art to understand the invention for various embodiments with various modifications as are suited to the particular use contemplated. To the extent that the following description is of a specific embodiment or a particular use of the invention, it is intended to be illustrative only, and not limiting of the claimed invention.

The corresponding structures, materials, acts, and equivalents of all means or steps plus function elements in the claims appended to this specification are intended to include any structure, material, or act for performing the function in combination with other claimed elements as specifically claimed.

References in the specification to "one embodiment", "an embodiment", etc., indicate that the embodiment described may include a particular aspect, feature, structure, or characteristic, but not every embodiment necessarily includes that aspect, feature, structure, or characteristic. Moreover, such phrases may, but do not necessarily, refer to the same embodiment referred to in other portions of the specification. Further, when a particular aspect, feature, structure, or characteristic is described in connection with an embodiment, it is within the knowledge of one skilled in the art to combine, affect or connect such aspect, feature, structure, or characteristic with other embodiments, whether or not such connection or combination is explicitly described. In other words, any element or feature may be combined with any other element or feature in different embodiments, unless there is an obvious or inherent incompatibility between the two, or it is specifically excluded.

It is further noted that the claims may be drafted to exclude any optional element. As such, this statement is intended to serve as antecedent basis for the use of exclusive terminology, such as "solely," "only," and the like, in connection with the recitation of claim elements or use of a "negative" limitation. The terms "preferably," "preferred," "prefer," "optionally," "may," and similar terms are used to indicate that an item, condition or step being referred to is an optional (not required) feature of the invention.

The singular forms "a," "an," and "the" include the plural reference unless the context clearly dictates otherwise. The term "and/or" means any one of the items, any combination of the items, or all of the items with which this term is associated. 11

As will be understood by one skilled in the art, for any and all purposes, particularly in terms of providing a written description, all ranges recited herein also encompass any and all possible sub-ranges and combinations of sub-ranges thereof, as well as the individual values making up the range, particularly integer values. A recited range (e.g., weight percent or carbon groups) includes each specific value, integer, decimal, or identity within the range. Any listed range can be easily recognized as sufficiently describing and enabling the same range being broken down into at least equal halves, thirds, quarters, fifths, or tenths. As a non-limiting example, each range discussed herein can be readily broken down into a lower third, middle third and upper third, etc.

As will also be understood by one skilled in the art, all ranges described herein, and all language such as "up to", "at least", "greater than", "less than", "more than", "or more", and the like, include the number(s) recited and such terms refer to ranges that can be subsequently broken down into sub-ranges as discussed above.

EXAMPLES

Example 1

Compound A of Formula I such as hexabenzocoronene (HBC) derivatized by mercaptyl can be prepared in a one-pot reaction consisting of nitration of hexabenzocoronene, reduction of the nitro group to the amine, diazotization and reaction of the diazo salt with $Na_2S$ to obtain the desired product. Preparation of HBC derivatized by or mercaptomethylene can be prepared by reaction of HBC with chloroiodomethane followed by reaction with $Na_2S$. Isolation (although a mixture of isomers and homologous byproducts can also be used) and characterization of the products can be performed by standard purification (e.g. chromatography, recrystallization) and analytical techniques (e.g. NMR, IR, MS, m.p) available in the art.

Example 2

Compound D of Formula IV such as trichlorosilylhexabenzocoronene can be prepared by brominating a p-hexabenzocoronene using the NBS reagent (AIBN, $CCl_4$) followed by reaction with tetrachlorosilane under inert conditions to obtain trichlorosilylhexabenzocoronene (G=hexabenzocoronene; X=—$SiCl_3$; $Y^1$=$Y^2$=—H). By using precaculated reagent ratio, a dibromo p-hexabenzocoronene can be obtained on the bromination step and having only one of the bromides substituted by a trichlorsilyl group to obtain bromo(trichlorosilyl)hexabenzocoronene (G=hexabenzocoronene; X=—$SiCl_3$; $Y^1$=—Br; $Y^2$=—H). Isolation (although a mixture of isomers and homologous byproducts can also be used) and characterization of the products can be performed by standard purification (e.g. chromatography, recrystallization) and analytical techniques (e.g. NMR, IR, MS, m.p) available in the art.

Example 3

Preparation of peri-halogeno(90% Br, 10% Cl)-p-hexabenzocoronene

Materials

Hexabenzo-Coronene=500 mg. (0.1 m. mole)
Bromine (2+1 ml)=9 g (56 m. moles)
Reduced Iron (catalyst)=10 mg.
Dibromomethane (DBM)=20 mis.

The materials including 2 ml bromine were added to a magnetically stirred glass flask wrapped in aluminium foil and fitted with a reflux condenser. After stirring for one day, a further 1 ml of bromine was added and the stirring was continued for a further day. Any emitted gases were collected and neutralized in a 10% solution of ammonia.

Work-Up:

After 2 days reaction, the contents of the flask were poured into a 5% solution of hydrochloric acid that dissolved the remaining iron and bromine.

The fine black powder dispersed between the aqueous phase and the organic phase, DBM. The aqueous phase was washed with chloroform which was added to the DBM phase. The combined organic phase was centrifuged, and a black powder was obtained. After drying in an oven, the yield was about 0.7 g (Calculated Yield=(1944/523)*500=1, 858 mg).

XRD Analysis:

The dry powder was analysed as previously reported by XRD in the SEM of the Agriculture Faculty of the Hebrew University in Rehovot, Israel. The relative sensitivity of the XRD to bromine and carbon was calibrated by measuring the bromine concentration in hexabromobenzene (Thermo Scientific) as a reference. Then the sample was analysed under identical conditions.

TABLE 1

Calculation of Bromine Correction Factor

| Hexabromobenzene | % O | % C | % Br |
|---|---|---|---|
| Measured | 3 ± 2 | 51 ± 11 | 46 ± 13 |
| Theoretical % Br/(C + Br) | 480/552 = 87% | | |
| Measured % Br/(C + Br) | (46 ± 13)/97 = 47 ± 13% | | |
| Br Correction Factor | 87/(47 ± 13) = 1.85 ± 0.4 | | |

TABLE 2

Bromine and Carbon in Brominated HBC as calculated from XRD measurements

| 2-21-10 | % C | % O | % Si | % Cl | % Br |
|---|---|---|---|---|---|
| Point 1 | 56 | 3 | 0.7 | 3 | 38 |
| Point 2 | 56 | 3 | 0.8 | 3 | 38 |

Calculation of Total Halogens:

$$Br+Cl=41\%\times\text{Correction Factor}(1.85\pm0.4)=76\pm14\%$$

Theoretical Br conc. for tribromination on each external ring of HBC=74%.

Preparation of Xylene Solution:

0.05 g of brominated product was stirred in 500 ml of xylene for about 10 days at room temperature. After slow dissolution a brown translucent solution or colloid was obtained.

Example 4

ALD can be used to deposit a graphene molecular precursor comprising a mixture of 1:10^10 mercaptomethylenelhexabenzocoronene/peri-halogeno(90% Br, 10% Cl)-p-hexabenzocoronene onto an interconnect net pattern embedded on a metallic wafer. ALD in a Savannah® 100 Veeco is exemplified. A solution of the graphene molecular precursor in xylene is placed in a reservoir. A ruthenium wafer, copper wafer and cobalt wafer are placed in the reactor. Temperatures in the precursor reservoir, the manifold leading from the reservoir to the reaction chamber and in the reaction chamber are respectively set to 130° C., 150° C. and 250° C. and stabilized for 10 minutes with 20 sccm nitrogen flow. Depositing repeated 100 times ("Cycles"). During each cycle the precursor valve is opened for 0.015 sec ("pulse") and then waiting for exposure 60 sec before evacuating and cleaning with $N_2$ flow.

Graphene synthesis can be performed by maintaining the thin film of the graphene molecular precursor at 250° C. for 60 minutes. Consequently, the ruthenium, copper and cobalt wafers are each covered by the graphene film wherein the surface of the metal wafer is covalently connected to the interfacial graphene layer film.

Characterization of the coated wafers is conducted by XPS and Raman spectroscopy.

Example 5

ALD can be used to deposit a graphene molecular precursor comprising a mixture of 1:10^10 mercaptomethylenehexabenzocoronene/octachloropyrene onto an interconnect net pattern following mutatis mutandis the same procedure and conditions as described in Example 4. The mixture of 1:10^10 mercaptomethylene-hexabenzocoronene/octachloropyrene can be prepared by serial dilutions of the two components and then solvating the mixture in xylene. The graphene molecular precursor can be applied by placing the mercaptomethylene-hexabenzocoronene/octachloropyrene solution in xylene in the reservoir. Alternatively, the deposition of each component of the graphene molecular precursor can be performed sequentially. Following the deposition of the mercaptomethylene-hexabenzocoronene at the conditions detailed above, the process can be repeated at the same conditions with the octachloropyrene, having the latter fill in voids which are left after the deposition of the former.

Consequently, the interconnect net pattern is covered by the graphene film wherein the surface of interconnect net pattern being covalently connected to the interfacial graphene layer film.

ALD is used to deposit a graphene molecular precursor comprising a mixture of 1:10^10 mercaptomethylene-hexabenzocoronene/octabromopyrene, that is prepared by sequential dilutions, onto an interconnect net pattern following the procedure above.

Characterization of the coated wafers is conducted by XPS and Raman spectroscopy.

Example 6

ALD can be used to deposit the graphene molecular precursor comprising peri-halogeno(90% Br, 10% Cl)-hexabenzocoronene onto a copper wafer, ruthenium wafer and/or cobalt wafer following mutatis mutandis the same procedure and conditions as described in Example 4.

Consequently, the metal wafers are covered by the graphene film wherein the surface of interconnect net pattern being covalently connected to the interfacial graphene layer film.

Characterization of the coated wafers is conducted by XPS and Raman spectroscopy.

Example 7

ALD of a graphene coating on a surface of a silicon wafer may be performed using Savannah® 100 Veeco by conducting the following: Hexabromobenzene (HBB) that is mixed with a trace (1:10^10) of mercaptethylbenzene precursor is inserted into the "Low Vapor Pressure Delivery" (LVPD) cylinder, bubbler kit.

A silicon wafer with thin Cu layer sample in the reactor under Nitrogen atmosphere in the reactor chamber. Nitrogen flow is set to 20 sccm.

Temperatures in the precursor reservoir, the manifold leading from the reservoir to the reaction chamber and in the reaction chamber are respectively set to 140° C., 150° C. and 180° C. and stabilized for 10 minutes with 20 sccm nitrogen flow. Depositing is repeated 100 cycles. During etch cycle the LVPD system valves are opened for 5 sec ("pulse") while the $N_2$ gas is flowing through the bubbler cylinder and carrying the precursor vapor molecules to the reactor chamber, then evacuate and clean the chamber with $N_2$ flow. Graphene synthesis can be performed by maintaining the thin film of the graphene molecular precursor at 250° C. for 60 minutes.

The reaction chamber is purged with a flow of nitrogen for 20 sec at 20 sccm and cool the system to room temperature.

The above procedure can be implemented mutatis mutandis on any of the graphene molecular precursors.

Example 8

ALD is used to deposit a thin metal layer on top of the graphene layers formed on a metal substrate. To create a uniform thin metal layer on top of the graphene by ALD, functional groups on the graphene surface are used; tethering groups that provide functional groups. Additionally, or alternatively, $O_3$ pre-treatment is used to mildly oxidize the graphene and leave epoxide (C—O) carbonyl (C═O) and carboxyl (O—C═O) groups on the graphene surface.

Ruthenium organometallic complex; η4-2,3-dimethylbutadiene ruthenium tricarbonyl ($Ru(DMBD)(CO)_3$) as a Ru precursor is used to deposit Ru thin layer on top of the graphene layers using Savannah® 100 Veeco. The decomposition of the Ruthenium organometallic complex by $H_2O$ follows procedures such as the procedure referred to in "Thermal atomic layer deposition of ruthenium metal thin films using nonoxidative coreactants" by S. Cwik et. al., published in J. Vac. Sci. Technol. A 38, 012402 (2020); doi: 10.1116/1.51251090.

$Ru(DMBD)(CO)_3$ as Ru precursor is placed in a reservoir, and a sample with graphene layers is placed in the reactor. Temperature in the reaction chamber is set to between 160° C. and 210° C. and stabilized for 20 minutes with 20 sccm nitrogen flow. After optional $O_3$ pre-treatment of the graphene layer, the Ru organometallic is repeatedly deposited in "pulses" and treated to decompose the complex:

1. A pulse of Ru(DMBD)(CO)3 is inserted into the chamber. Pulse length is determined by the pulse length required to reach surface saturation. To ensure the deposition of the Ru organometallic complex on the functionalized graphene surface sufficient wait time (e.g., 30 sec) is used between cycles.
2. Next, the reactor is evacuated and cleaned with $N_2$ flow for 10 sec.
3. Following the evacuation step a pulse of $H_2O$ is provided with a, and waiting cycle for exposure and decomposition of the organometallic complex.
4. Next, the reactor is evacuated and cleaned with $N_2$ flow.

Characterization of the oxidized graphene can be conducted by XPS and Raman spectroscopy, and the metal coated sample can be characterized using XPS, SEM. TEM.

The invention claimed is:

1. A method for coating a metal surface with graphene comprising the steps of obtaining a metal having a surface;

obtaining a first graphene molecular precursor comprising at least one compound selected from the group consisting of:

compound A having molecular formula I $$G-X_i^1Y_m^1Y_n^2, \text{ and} \qquad \text{formula I}$$

compound B having molecular formula II $$G-X_i^1X_j^2Y_m^1Y_n^2 \qquad \text{formula II}$$

wherein,

G is a $C_6$-$C_{100}$ hydrocarbon component, $X^1$ is a tethering group to the surface of the metal material, $X^2$ is selected from at least one of:

a tethering group to a graphene surface $X^{2G}$, a tethering group to a metal layer $X^{2M}$, and a tethering group to a non-metal layer $X^{2N}$, $Y^1$, $Y^2$ are independently selected from the group consisting of hydrogen, halogen radical, hydroxyl and —COOH and i, j, m and n are independent integer numbers having a value selected between 1 and 20, and wherein (I)

(i) the first graphene molecular precursor further comprises compound C having formula III and optionally compound D having molecular formula IV $$G-Y^1_mY^2_n; \quad \text{formula III}$$

$$G-X^2_jY^1_mY^2_n \quad \text{formula IV}$$

and the mol ratio between compound C and the combined amount of compounds A, B and D is between 1:10 to 1000:1, or (ii) $X^1$ is selected from the group consisting of $—R^1COOR^2$, $—R^1SO_3R^2$, $—R^1PO_3H_2$, $—R^1COH$, and $R^1SH$ wherein $R^1$ is selected from a bond, $C_{1-8}$ saturated or unsaturated, substituted or unsubstituted alkyl; $R^2$ is H or $C_{1-8}$ saturated or unsaturated, substituted or unsubstituted alkyl;

depositing said first graphene molecular precursor on top of the metal surface to obtain a surface at least partially coated with the at least one graphene molecular precursor and bound to the at least one graphene molecular precursor; and transforming the deposited first graphene molecular precursor into a surface bound graphene interfacial layer, to obtain a graphene coated metal surface comprising a graphene interfacial layer bound to the surface of the metal; or (II)

depositing said first graphene molecular precursor on top of the metal surface to obtain a surface at least partially coated with the at least one graphene molecular precursor and bound to the at least one graphene molecular precursor; and transforming the deposited first graphene molecular precursor into a surface bound graphene interfacial layer to obtain a graphene coated metal surface comprising a graphene interfacial layer bound to the surface of the metal, obtaining a second graphene precursor comprising at least one compound selected from the group consisting of compound A, compound B, compound C having formula III, compound D having molecular formula IV, compound E having molecular formula V $$G-X^3_iY^1_mY^2_n, \text{ and} \quad \text{formula V}$$

compound F having molecular formula VI $$G-X^2_iX^3_jY^1_mY^2_n \quad \text{formula VI}$$

wherein, G is a $C_6$-$C_{100}$ hydrocarbon component, $X^3$ is a tethering group to the surface of the graphene coating being different than the tethering group $X^2$, $Y^1$, $Y^2$ are independently selected from the group consisting of hydrogen, halogen radical and —COOH and i, j, m and n are independent integer numbers having a value selected between 1 and 20;

and wherein at least one compound of the first graphene molecular precursor, the second graphene molecular precursor or both first and second molecular precursors, is functionalized by group $X^{2G}$ depositing the second graphene molecular precursor on top of a graphene coating of the graphene coated metal surface to obtain a graphene coated material wherein the graphene coated metal surface being at least partially coated with the second graphene molecular precursor; and transforming the deposited second graphene precursor into a top graphene coating;

to obtain a graphene coating comprising at least a graphene interfacial layer and a top graphene coating, the graphene interfacial layer being bound to the surface of the metal.

2. The method of claim 1 wherein depositing comprises depositing by vacuum deposition.

3. The method according to claim 2 wherein the vacuum deposition is atomic layer deposition.

4. The method of claim 1 wherein G is a $C_{10}$-$C_{100}$ polycyclic aromatic hydrocarbon (PAH), optionally comprising heteroatoms selected from silicon, sulfur, nitrogen and oxygen.

5. The method of claim 1 wherein $X^{2G}$ is selected from the group consisting of $C_6$-$C_{20}$ aryl unsubstituted or substituted by an electron withdrawing group, $C_6$-$C_{20}$ substituted or unsubstituted heteroaryl, $—R^1X$, $—NR^3R^4$, $—R^1COOH$, $—R^1SO_3R^2$, and $—R^1PO_3H_2$, wherein $R^1$ is selected from a bond, $C_{1-8}$ saturated or unsaturated, substituted or unsubstituted alkyl, X is selected from —OH, —Cl, —Br, —F, or —I, $R^3$ and $R^4$ are independently selected from H, $C_{1-8}$ saturated or unsaturated optionally derivatized alkyl.

6. The method of claim 5 wherein the electron withdrawing group is selected from the group consisting of a halide, —CN, $—NO_2$, —CHO, $—COOR^2$, and $—C(=O)R^5$, wherein $R^2$ is H or $C_{1-8}$ saturated or unsaturated, substituted or unsubstituted alkyl and $R^5$ is $C_{1-8}$ saturated or unsaturated, substituted or unsubstituted alkyl.

7. The method of claim 1 wherein $X^{2N}$ is selected from the group consisting of $C_{1-8}$ siloxyl, $—R^1SO_3R^2$, $—R^1PO_3H_2$, $—SiR^1R^2R^3$, $—NR^4R^5$, $—R^5COOR^6$ and $R^7SH$ wherein $R^1$, $R^2$, and $R^3$ are independently selected from H, —OH, —Cl, —Br, —F, —I, $C_{1-8}$ saturated or unsaturated optionally derivatized alkyl, and at least one of $R^1$, $R^2$, and $R^3$ is —Cl, —Br, —F or —I; $R^4$ and $R^5$ are independently selected from H, $C_{1-8}$ saturated or unsaturated optionally derivatized alkyl; $R^6$ is H or $C_{1-8}$ saturated or unsaturated optionally derivatized alkyl; $R^7$ is a bond or $C_{1-8}$ saturated or unsaturated optionally derivatized alkyl.

8. The method of claim 1 wherein $Y^1$ and $Y^2$ are independently selected from the group consisting of H, —OH, —Cl, —Br, —F, —I.

9. The method of claim 1 further comprising maintaining the temperature of the metallic surface at below 400° C.

10. The method of claim 1 further comprising at least one of: (i) detecting the Raman scattering while radiating with a second radiation source, IR light, characterizing presence of graphene, the Raman scattering is indicative of a presence of a full layer of graphene; (ii) measuring contact angle of the surface; (iii) detecting fluorescence of the surface; and (iv) measuring surface contact angle of the substrate and identifying typical surface contact angle measurement as evidence for formation of a desired surface after each step of the manufacturing process.

11. The method of claim 1, wherein at least one of the following holds true: (i) the graphene coating being bound to the metal surface by covalent bonds; (ii) the graphene coating defect ratio is lower than 1E-10 defects/$cm^2$; and (iii) the graphene coated metal material is for use in a device selected from the group consisting of interconnection, a device selected from back end of lines (BEOL), nano-electro mechanical device; Organic LED, transparent conductive electrodes, electro-optical sensor, graphene transistor, or a high conduction interconnect.

12. The method of claim 1 wherein for condition (II), the steps of obtaining a second graphene molecular precursor, depositing of said second graphene molecular precursor on top of the graphene coating and transforming the deposited graphene molecular precursor to a top graphene coating are repeated to obtain a graphene coating comprising at least three graphene coatings, the graphene interfacial layer being bound to the first surface.

13. The method of claim 1 wherein for condition (II), at least one of the compounds of the second graphene molecular precursor comprises a compound having a tethering group $X^{2n}$, and further comprising: depositing a non-metal material on top of the top graphene coating to obtain a layered structure comprising a graphene coating bound to the metal surface and bound to a non-metal material layer on top of the graphene coating.

14. The method of claim 1 wherein for condition (II), the metal material is a first metal material, at least one of the compounds of the second graphene molecular precursor comprises a compound having a tethering group $X^{2m}$ and further comprising the step of depositing a second metal having a surface being same as, or different from the first metal surface on top of the top graphene coating, to obtain a layered structure comprising a graphene coating bound to the metal surface and bound to the second metal material layer on top of the graphene coating.

15. The method of claim 1 wherein for condition (II), at least two separate first graphene molecular precursor mixtures are obtained, at least one mixture comprising compound C and at least one other mixture comprising compound A and compound B, wherein depositing comprises separately depositing separate mixtures to obtain an interspersed coating with at least two graphene molecular precursors.

16. The method of claim 1 wherein the metal material is a first metal material and at least one compound of the first graphene molecular precursor having tethering groups $X^{2m}$ to a second metal having a surface being same as, or different from the first metal material, and further comprising depositing a second metal having a surface being same as, or different from the first metal surface on top of the graphene interfacial layer, to obtain a layered structure comprising a graphene interfacial layer bound to the metal surface and bound to the second metal material layer on top of the graphene interfacial layer.

17. The method of claim 1 wherein for condition (II), (i) the first graphene molecular precursor comprises a compound comprising $X^{2G}$ being a basic group—and the second graphene molecular precursor comprises a compound comprising $X^{2G}$ being an acidic group —$R^1COOH$, or (ii) the first graphene molecular precursor comprises a compound comprising $X^{2G}$ being an acidic group —$R^1COOH$, and the second graphene molecular precursor comprises a compound comprising $X^{2G}$ being a basic group $X^2$ is —$NR^3R^4$.

18. A graphene coated metal surface comprising a covalent bond between the graphene coating and the metal surface, using the method of claim 1.

19. The graphene coated metal surface according to claim 18 further characterized by at least one of:

(i) a graphene defect density equal to or lower than $10^{12}$ defects per $cm^2$;

(ii) essentially free of catalytic metal residue;

(iii) graphene coverage higher than 90%;

(iv) comprises at least two layers of graphene coatings;

(v) comprising at least a graphene interfacial layer bound to the surface of the metal material and a top graphene coating positioned above the bottom graphene coating;

(vi) comprises between 2-6 layers of graphene;

(vii) comprises a bond between two adjacent graphene coatings;

(viii) comprises a bond selected from a covalent bond and a π-π interaction between two adjacent graphene coatings;

(ix) a top graphene layer of the graphene coating is bound to a surface of a material deposited on top of said top graphene layer.

20. A device comprising a graphene coated metal surface of claim 19.

* * * * *